(12) United States Patent
Cohen et al.

(10) Patent No.: US 11,870,443 B2
(45) Date of Patent: *Jan. 9, 2024

(54) FREQUENCY GENERATION IN A QUANTUM CONTROLLER

(71) Applicant: Quantum Machines, Tel Aviv (IL)

(72) Inventors: Yonatan Cohen, Tel Aviv (IL); Nissim Ofek, Tel Aviv (IL); Itamar Sivan, Tel Aviv (IL)

(73) Assignee: Quantum Machines

( * ) Notice: Subject to any disclaimer, the term of this patent is extended or adjusted under 35 U.S.C. 154(b) by 0 days.

This patent is subject to a terminal disclaimer.

(21) Appl. No.: 17/853,132

(22) Filed: Jun. 29, 2022

(65) Prior Publication Data
US 2023/0123630 A1    Apr. 20, 2023

Related U.S. Application Data

(63) Continuation of application No. 17/152,970, filed on Jan. 20, 2021, now Pat. No. 11,387,820, which is a
(Continued)

(51) Int. Cl.
G06N 10/00    (2022.01)
H03K 3/38    (2006.01)

(52) U.S. Cl.
CPC .............. *H03K 3/38* (2013.01); *G06N 10/00* (2019.01)

(58) Field of Classification Search
CPC ..... G06F 1/04; G06F 1/06; G06F 1/08; G06F 1/10; G06N 10/00; H03K 3/014;
(Continued)

(56) References Cited

U.S. PATENT DOCUMENTS 4,875,484 A    10/1989 Anzai et al.
5,063,354 A  * 11/1991 Lauper ................... H03B 23/00
                                                          327/107
(Continued)

FOREIGN PATENT DOCUMENTS

CA    2420022    2/2003
CN    104467843    3/2015
(Continued)

OTHER PUBLICATIONS

Int'l Search Report and Written Opinion Appln No. PCT/IB2022/000024 dated Jul. 18, 2022.
(Continued)

*Primary Examiner* — Long Nguyen
(74) *Attorney, Agent, or Firm* — McAndrews, Held & Malloy, Ltd.

(57) ABSTRACT

A system comprises time-tracking circuitry and phase parameter generation circuitry. The time-tracking circuitry is operable to generate a time-tracking value corresponding to time elapsed since a reference time. The phase parameter generation circuitry operable to: receive the time-tracking value; receive a control signal that conveys a frequency parameter corresponding to a desired frequency of an oscillating signal; and generate a plurality of phase parameters used for generation of an oscillating signal, wherein the generation of the plurality of phase parameters is based on the time-tracking value and the frequency parameter such that the oscillating signal maintains phase continuity across changes in the frequency parameter.

20 Claims, 14 Drawing Sheets

Related U.S. Application Data continuation of application No. 16/715,633, filed on Dec. 16, 2019, now Pat. No. 10,931,267, which is a continuation of application No. 16/527,782, filed on Jul. 31, 2019, now Pat. No. 10,560,076.

(58) Field of Classification Search
CPC ............ H03K 3/38; H03K 4/92; H03K 17/92; H03K 19/00346; H03K 19/195; H01L 23/49596; H03B 39/00; H03B 2202/01; H03B 2202/017; H03B 21/00; H03B 21/01; H03L 7/06; H03L 7/07
See application file for complete search history.

(56) References Cited

U.S. PATENT DOCUMENTS

| | | | |
|---|---|---|---|
| 5,194,907 | A | 3/1993 | Hayashi |
| 6,223,228 | B1 | 4/2001 | Ryan et al. |
| 6,426,984 | B1 | 7/2002 | Perino et al. |
| 6,993,108 | B1 | 1/2006 | Chi et al. |
| 7,451,292 | B2 | 11/2008 | Routt |
| 7,535,931 | B1 | 5/2009 | Zampetti et al. |
| 7,627,126 | B1 | 12/2009 | Pikalo |
| 8,315,969 | B2 | 11/2012 | Roetteler |
| 8,385,878 | B2 | 2/2013 | Rao |
| 8,750,717 | B1 | 6/2014 | Yap et al. |
| 9,207,672 | B2 | 12/2015 | Williams |
| 9,400,499 | B2 | 7/2016 | Williams |
| 9,509,324 | B2 | 11/2016 | McDonald et al. |
| 9,663,358 | B1 | 5/2017 | Cory et al. |
| 9,692,423 | B2 | 6/2017 | McDermott, III |
| 9,847,121 | B2 | 12/2017 | Frank |
| 9,858,531 | B1 | 1/2018 | Monroe |
| 9,892,365 | B2 | 2/2018 | Rigetti |
| 9,978,020 | B1 | 5/2018 | Gambetta |
| 9,979,400 | B1 | 5/2018 | Sete |
| 9,996,801 | B2 | 6/2018 | Shim |
| 10,063,228 | B2 | 8/2018 | Deurloo et al. |
| 10,122,351 | B1 | 11/2018 | Naaman |
| 10,127,499 | B1 | 11/2018 | Rigetti |
| 10,192,168 | B2 | 1/2019 | Rigetti |
| 10,223,643 | B1 | 3/2019 | Bishop et al. |
| 10,333,503 | B1 | 6/2019 | Cohen et al. |
| 10,454,459 | B1 | 10/2019 | Cohen |
| 10,496,069 | B2 | 12/2019 | Nazarathy et al. |
| 10,505,524 | B1 | 12/2019 | Cohen |
| 10,560,076 | B1 * | 2/2020 | Cohen .................... G06N 10/00 |
| 10,637,449 | B1 | 4/2020 | Cohen et al. |
| 10,659,018 | B1 | 5/2020 | Cohen |
| 10,666,238 | B1 | 5/2020 | Cohen |
| 10,931,267 | B1 * | 2/2021 | Cohen .................... H03K 3/38 |
| 10,958,253 | B1 | 3/2021 | Cohen et al. |
| 10,985,739 | B2 | 4/2021 | Cohen et al. |
| 11,010,145 | B1 | 5/2021 | Smith et al. |
| 11,387,820 | B2 * | 7/2022 | Cohen .................... H03K 3/38 |
| 11,463,075 | B2 | 10/2022 | Cohen et al. |
| 11,616,497 | B2 | 3/2023 | Cohen et al. |
| 11,616,498 | B2 | 3/2023 | Cohen et al. |
| 2002/0004876 | A1 | 1/2002 | Timmer et al. |
| 2004/0266084 | A1 | 12/2004 | Fujishima et al. |
| 2005/0015422 | A1 | 1/2005 | Kohn et al. |
| 2005/0180575 | A1 | 8/2005 | Maeda et al. |
| 2006/0093376 | A1 | 5/2006 | Mitchell et al. |
| 2008/0037693 | A1 | 2/2008 | Andrus et al. |
| 2011/0035511 | A1 | 2/2011 | Biederman |
| 2013/0198499 | A1 | 8/2013 | Dice et al. |
| 2016/0125311 | A1 | 5/2016 | Fuechsle et al. |
| 2016/0267032 | A1 | 9/2016 | Rigetti et al. |
| 2016/0292586 | A1 | 10/2016 | Rigetti et al. |
| 2017/0094618 | A1 | 3/2017 | Bjorkengren |
| 2017/0214410 | A1 | 7/2017 | Hincks et al. |
| 2017/0364796 | A1 | 12/2017 | Wiebe |
| 2018/0013426 | A1 | 1/2018 | Deurloo et al. |
| 2018/0032893 | A1 | 2/2018 | Epstein |
| 2018/0091244 | A1 | 3/2018 | Abdo |
| 2018/0107579 | A1 | 4/2018 | Chapman |
| 2018/0123597 | A1 | 5/2018 | Sete |
| 2018/0237039 | A1 | 8/2018 | Mong et al. |
| 2018/0260245 | A1 | 9/2018 | Smith |
| 2018/0260730 | A1 | 9/2018 | Reagor |
| 2018/0260732 | A1 | 9/2018 | Bloom |
| 2018/0308007 | A1 | 10/2018 | Amin |
| 2018/0322409 | A1 | 11/2018 | Barends |
| 2018/0365585 | A1 | 12/2018 | Smith |
| 2018/0373995 | A1 | 12/2018 | Tomaru et al. |
| 2018/0375650 | A1 | 12/2018 | Legre |
| 2019/0042964 | A1 | 2/2019 | Elsherbini et al. |
| 2019/0042965 | A1 | 2/2019 | Clarke |
| 2019/0042970 | A1 | 2/2019 | Zou |
| 2019/0042971 | A1 | 2/2019 | Zou |
| 2019/0042972 | A1 | 2/2019 | Zou |
| 2019/0042973 | A1 | 2/2019 | Zou |
| 2019/0049495 | A1 | 2/2019 | Ofek |
| 2019/0251478 | A1 | 8/2019 | Bishop et al. |
| 2019/0266512 | A1 | 8/2019 | Shen et al. |
| 2019/0302832 | A1 | 10/2019 | Morgan et al. |
| 2019/0317589 | A1 | 10/2019 | Mathur et al. |
| 2019/0385088 | A1 | 12/2019 | Naaman et al. |
| 2020/0293080 | A1 | 9/2020 | Poon et al. |
| 2020/0364602 | A1 | 11/2020 | Niu et al. |
| 2021/0004707 | A1 | 1/2021 | Gambetta et al. |
| 2021/0103847 | A1 | 4/2021 | Akzam |
| 2021/0125096 | A1 | 4/2021 | Puri et al. |

FOREIGN PATENT DOCUMENTS

| | | |
|---|---|---|
| CN | 105281886 A | 1/2016 |
| CN | 105912070 A | 8/2016 |
| CN | 108111306 A | 6/2018 |
| CN | 108594214 A | 9/2018 |
| CN | 110085094 A | 8/2019 |
| CN | 110677210 | 1/2020 |
| CN | 111464154 A | 7/2020 |
| CN | 111767055 A | 10/2020 |
| CN | 112019193 A | 12/2020 |
| CN | 112149832 A | 12/2020 |
| EP | 0388052 | 9/1990 |
| JP | 2011175078 A | 9/2011 |
| JP | 2012188875 | 10/2012 |
| WO | 2015178991 A2 | 11/2015 |
| WO | 2015178992 A2 | 11/2015 |
| WO | 2017078735 A1 | 5/2017 |
| WO | 2017123940 | 7/2017 |
| WO | 2017139683 A1 | 8/2017 |
| WO | 2018055607 | 3/2018 |
| WO | 2018062991 A1 | 4/2018 |
| WO | 2019063117 A1 | 4/2019 |
| WO | 2020033807 A1 | 2/2020 |
| WO | 2020231795 A1 | 11/2020 |
| WO | 2021/123903 | 6/2021 |

OTHER PUBLICATIONS

Baier, Simon, Matteo Pompili, Sophie LN Hermans, Hans KC Beukers, Peter C. Humphreys, Raymond N. Schouten, Raymond FL Vermeulen et al. "Realization of a Multi-Node Quantum Network of Remote Solid-State Qubits", Science, vol. 372, pp. 259-264 (2021) Baier Simon Apr. 16, 2021 (Apr. 16, 2021).

Int'l Search Report and Written Opinion Appln No. PCT/IB2022/000068 dated Jul. 17, 2022.

D. Copsey et al., "Toward a scalable, silicon-based quantum computing architecture," in IEEE Journal of Selected Topics in Quantum Electronics, vol. 9, No. 6, pp. 1552-1569, Nov.-Dec. 2003, doi: 10.1109/JSTQE.2003.820922. Dec. 31, 2003 (Dec. 31, 2003).

U.S. Appl. No. 62/294,966, filed Feb. 12, 2016.

Int'l Search Report and Written Opinion Appln No. PCT/IB2019/001410 dated Jun. 10, 2020.

Int'l Search Report and Written Opinion Appln No. PCT/IB2019/001394 dated Jun. 17, 2020.

Zhang J, Hegde SS, Suter D. Pulse sequences for controlled 2- and 3-qubit gates in a hybrid quantum register. arXiv preprint arXiv:1806.08408. Jun. 21, 2018.

(56) References Cited

OTHER PUBLICATIONS

Wang CY, Kuznetsova L, Gkortsas VM, Diehl L, Kaertner FX, Belkin MA, Belyanin A, Li X, Ham D, Schneider H, Grant P. Mode locked pulses from mid-infrared quantum cascade lasers. Optics Express. Jul. 20, 2009;17(15):12929-43.
Int'l Search Report and Written Opinion Appln No. PCT/IB2020/000218 dated Aug. 11, 2020.
Quan R, Zhai Y, Wang M, Hou F, Wang S, Xiang X, Liu T, Zhang S, Dong R. Demonstration of quantum synchronization based on second-order quantum coherence of entangled photons. Scientific reports. Jul. 25, 2016;6:30453. Jul. 25, 2016 (Jul. 25, 2016).
Int'l Search Report and Written Opinion Appln No. PCT/IB2020/000376 dated Sep. 17, 2020.
Breitfelder et al. eds., IEEE 100: The Authoritative Dictionary of IEEE Standards Terms 1247, definition 2 of "variable" (7th ed. 2000). (Year: 2000).
Int'l Search Report and Written Opinion Appln No. PCT/IB2020/000707 dated Jan. 12, 2021.
National Academies of Sciences, Engineering, and Medicine. "Quantum Computing: Progress and Prospects". eprint (Dec. 2018) [online]. [retrieved on Jan. 7, 2020]. retrieved from: <https://doi.org/10.17226/25196.> Dec. 4, 2018 (Dec. 4, 2018) pp. 114, 142, 210, Fig. 2.5, Qiskit Backend Specifications at footnote 57: section 4.2, 5.1.5, Fig. 3, Fig. 4 , pp. 30, 57.
IBM Research. "Qiskit Backend Specifications for OpenQASM and OpenPulse Experiments". eprint arXiv:1809.03452v1 (Sep. 10, 2018) [online]. [retrieved on Jan. 7, 2020]. retrieved from: <https://arxiv.org/pdf/1809.03452.pdf> Sep. 10, 2018 (Sep. 10, 2018) section 4.2, 5.1.5, Fig. 3, Fig. 4 , pp. 30, 57.
Int'l Search Report and Written Opinion Appln No. PCT/IB2020/000704 dated Jan. 17, 2021.
Wolfowicz, et al. Pulse Techniques for Quantum Information Processing University of Chicago, University College ondon, eMagRes, 2016, vol. 5: 1515-1528. DOI 10.1002/9780470034590.emrstm1521.
Int'l Search Report and Written Opinion Appln No. PCT/IB2020/000555 dated Dec. 27, 2020.
Int'l Search Report and Written Opinion Appln No. PCT/IB2020/000760 dated Jan. 27, 2021.
"Quantum-classical interface based on single flux quantum digital logic". In: Quantum Science and Technology 3.2 (2018), pp. 1-16. DOI: 10.1088/2058-9565/aaa3a0. (retrieved on Jan. 20, 2021). Retrieved from the Internet: < https://arxiv.org/pdf/1710.04645.pdf > McDermott R. et al. Oct. 12, 2017 (Oct. 12, 2017) Section VI, VII, VIII.
Roffe, J., Quantum Error Correction: An Introductory Guide, Dept. of Physics & Astronomy, Univ. of Sheffeld, UK, Oct. 10, 2019, pp. 1-29.
Int'l Search Report and Written Opinion Appln No. PCT/IB2020/001004 dated May 13, 2021.
Int'l Preliminary Report on Patentability Appln No. PCT/IB2019/001410 dated Jun. 10, 2021.
Int'l Search Report and Written Opinion Appln No. PCT/IB2021/000067 dated Jun. 21, 2021.
Int'l Preliminary Report on Patentability Appln No. PCT/IB2019/001394 dated Jul. 29, 2021.
Int'l Preliminary Report on Patentability Appln No. PCT/IB2020/000218 dated Sep. 16, 2021.
Int'l Preliminary Report on Patentability Appln No. PCT/IB2020/000376 dated Nov. 12, 2021.
Int'l Search Report and Written Opinion Appln No. PCT/IB2021/056254 dated Dec. 1, 2021.
Ribeiro, Diogo C., Pedro M. Cruz, and Nuno Borges Carvalho, "Towards a denser frequency grid in phase measurements using mixer-based receivers." 2015 85th Microwave Measurement Conference (ARFTG). IEEE, 2015. Dec. 31, 2015 (Dec. 31, 2015).
Int'l Preliminary Report on Patentability Appln No. PCT/IB2020/000555 dated Feb. 10, 2022.
Int'l Preliminary Report on Patentability Appln No. PCT/IB2020/000707 dated Mar. 17, 2022.
Int'l Preliminary Report on Patentability Appln No. PCT/IB2020/000704 dated Mar. 17, 2022.
Int'l Preliminary Report on Patentability Appln No. PCT/IB2020/000760 dated Apr. 7, 2022.
Int'l Search Report and Written Opinion Appln No. PCT/IB2022/050190 dated Apr. 11, 2022.
Int'l Search Report and Written Opinion Appln No. PCT/IB2022/000059 dated Jul. 7, 2022.
Moreira , "QuTech Central Controller: A Quantum Control Architecture for a Surface-17 Logical Qubit." Delft University of Technology Student Theses Collection (2019). Available at the following URL: http://resolver.tudelft.nl/uuid:502ed5e5-87f7-42bd-a077-c24b7281cd94 May 10, 2019 (May 10, 2019).
Int'l Preliminary Report on Patentability Appln No. PCT/IB2020/001004 dated Jun. 30, 2022.
Extended European Search Report Appln No. 19889443.8 dated Aug. 4, 2022.
Int'l Search Report and Written Opinion Appln No. PCT/IB2022/054903 dated Sep. 8, 2022.
Int'l Preliminary Report on Patentability Appln No. PCT/IB2021/000067 dated Sep. 22, 2022.
Int'l Search Report and Written Opinion Appln No. PCT/IB2022/053304 dated Oct. 6, 2022.
Serrano, Javier, M. Lipinski, T. Wlostowski, E. Gousiou, Erik van der Bij, M. Cattin, and G. Daniluk. "The white rabbit project." (2013) Sep. 19, 2013 (Sep. 19, 2013) Entire document.
Extended European Search Report Appln No. 19910800.2 dated Oct. 6, 2022.
Hornibrook J M et al: "Cryogenic Control Architecture for Large-Scale Quantum Computing", arxiv.org, Cornell University Library, 201 Olin Library Cornell University Ithaca, NY 14853, Sep. 8, 2014 (Sep. 8, 2014), XP081391509.
Fu X et al: "An Experimental Microarchitecture for a Superconducting Quantum Processor", MICRO-50 '17: Proceedings of the 50th Annual IEEE/ACM International Symposium on Microarchitecture, Cornell University Library, 201 Olin Library Cornell University Ithaca, NY 14853, Oct. 14, 2017 (Oct. 14, 2017), pp. 1-13, XP081291220.
Zopes J et al: "High resolution quantum sensing with shaped control pulses", arxiv.org, Cornell University Library, 201 Olin Library Cornell University Ithaca, NY 14853, May 22, 2017 (May 22, 2017), XP081276850.
Cross et al. "Open Quantum Assembly Language", Jan. 10, 2017.
European Office Communication with extended Search Report Appln No. 20766036.6 dated Nov. 24, 2022.
Japanese Patent Office Action Appln No. 2021-529723 dated Oct. 26, 2022 with translation.
Lavoie et al., "A Formalization for Specifying and Implementing Correct Pull-Stream Modules," in arXiv preprint arXiv: 1801.06144 (2018). (Year: 2018).
Fu et al., "A Microarchitecture for a Superconducting Quantum Processor," in 38.3 IEEE Micro 40-47 (2018). (Year: 2018).
European Office Communication with extended Search Report Appln No. 20845965.1 dated Jun. 29, 2023.

* cited by examiner

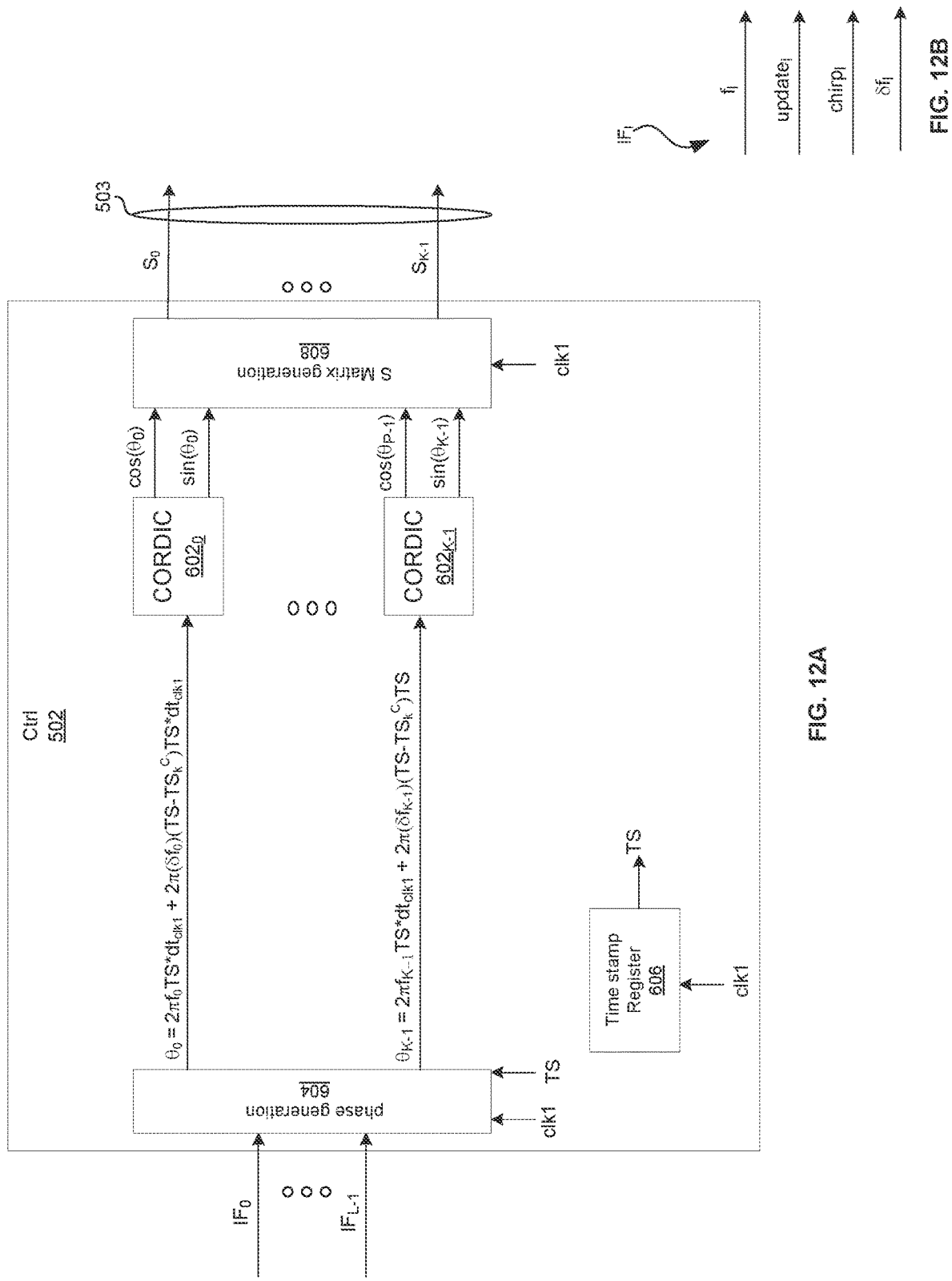

FREQUENCY GENERATION IN A QUANTUM CONTROLLER

PRIORITY CLAIM

This application is a continuation of Ser. No. 17/152,970 filed Jan. 20, 2021, which is a continuation of Ser. No. 16/715,633, filed on Dec. 16, 2019 (U.S. Pat. No. 10,931,267) which is a continuation of Ser. No. 16/527,782, filed Jul. 31, 2019 (U.S. Pat. No. 10,560,076). The aforementioned documents are all incorporated herein by reference in their entirety.

BACKGROUND

Limitations and disadvantages of conventional approaches to frequency generation in quantum computer control systems will become apparent to one of skill in the art, through comparison of such approaches with some aspects of the present method and system set forth in the remainder of this disclosure with reference to the drawings.

BRIEF SUMMARY

Methods and systems are provided for frequency generation in a quantum controller, substantially as illustrated by and/or described in connection with at least one of the figures, as set forth more completely in the claims.

BRIEF DESCRIPTION OF THE DRAWINGS

FIG. 12A shows an example frequency generation circuitry operable to generate chirps.

FIG. 12B shows example components of the control signal $IF_l$ of FIG. 12A.

DETAILED DESCRIPTION

Classical computers operate by storing information in the form of binary digits ("bits") and processing those bits via binary logic gates. At any given time, each bit takes on only one of two discrete values: 0 (or "off") and 1 (or "on"). The logical operations performed by the binary logic gates are defined by Boolean algebra and circuit behavior is governed by classical physics. In a modern classical system, the circuits for storing the bits and realizing the logical operations are usually made from electrical wires that can carry two different voltages, representing the 0 and 1 of the bit, and transistor-based logic gates that perform the Boolean logic operations.

Figure 1A:
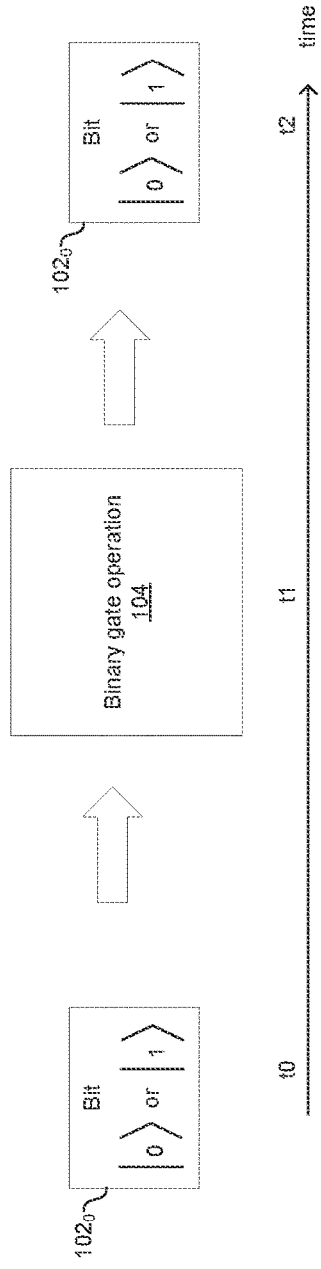
FIGS. 1A and 1B compare some aspects of classical (binary) computing and quantum computing.

Shown in FIG. 1A is a simple example of a classical computer configured to a bit 102 and apply a single logic operation 104 to the bit 102. At time t0 the bit 102 is in a first state, at time t1 the logic operation 104 is applied to the bit 102, and at time t2 the bit 102 is in a second state determined by the state at time t0 and the logic operation. So, for example, the bit 102 may typically be stored as a voltage (e.g., 1 Vdc for a "1" or 0 Vdc for a "0") which is applied to an input of the logic operation 104 (comprised of one or more transistors). The output of the logic gate is then either 1Vdc or 0Vdc, depending on the logic operation performed.

Obviously, a classical computer with a single bit and single logic gate is of limited use, which is why modern classical computers with even modest computation power contain billions of bits and transistors. That is to say, classical computers that can solve increasingly complex problems inevitably require increasingly large numbers of bits and transistors and/or increasingly long amounts of time for carrying out the algorithms. There are, however, some problems which would require an infeasibly large number of transistors and/or infeasibly long amount of time to arrive at a solution. Such problems are referred to as intractable.

Quantum computers operate by storing information in the form of quantum bits ("qubits") and processing those qubits via quantum gates. Unlike a bit which can only be in one state (either 0 or 1) at any given time, a qubit can be in a superposition of the two states at the same time. More precisely, a quantum bit is a system whose state lives in a two dimensional Hilbert space and is therefore described as a linear combination $\alpha|0\rangle + \beta|1\rangle$, where $|0\rangle$ and $|1\rangle$ are two basis states, and $\alpha$ and $\beta$ are complex numbers, usually called probability amplitudes, which satisfy $|\alpha|^2+|\beta|^2=1$. Using this notation, when the qubit is measured, it will be 0 with probability $|\alpha|^2$ and will be 1 with probability $|\beta|^2$. $|0\rangle$ and $|1\rangle$ can also be represented by two-dimensional basis vectors $$\begin{bmatrix}1\\0\end{bmatrix} \text{ and } \begin{bmatrix}0\\1\end{bmatrix},$$

respectively, and then the qubit state is represented by $$\begin{bmatrix}\alpha\\\beta\end{bmatrix}.$$

The operations performed by the quantum gates are defined by linear algebra over Hilbert space and circuit behavior is governed by quantum physics. This extra richness in the mathematical behavior of qubits and the operations on them, enables quantum computers to solve some problems much faster than classical computers (in fact some problems that are intractable for classical computers may become trivial for quantum computers).

Figure 1B:
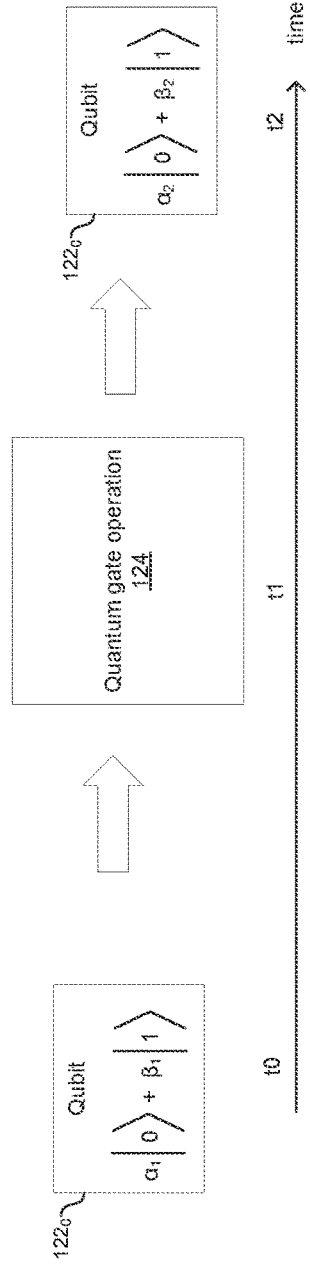

Shown in FIG. 1B is a simple example of a quantum computer configured to store a qubit 122 and apply a single quantum gate operation 124 to the qubit 122. At time t0 the qubit 122 is described by $\alpha_1|0\rangle + \beta_1|1\rangle$, at time t1 the logic operation 104 is applied to the qubit 122, and at time t2 the qubits 122 is described by $\alpha_2|0\rangle + \beta_2|1\rangle$.

Unlike a classical bit, a qubit cannot be stored as a single voltage value on a wire. Instead, a qubit is physically realized using a two-level quantum mechanical system. Many physical implementations of qubits have been proposed and developed over the years with some being more promising than others. Some examples of leading qubits implementations include superconducting circuits, spin qubits, and trapped ions.

It is the job of the quantum controller to generate the precise series of external signals, usually pulses of electromagnetic waves and pulses of base band voltage, to perform the desired logic operations (and thus carry out the desired quantum algorithm). Example implementations of a quantum controller are described in further detail below.

Figure 2:
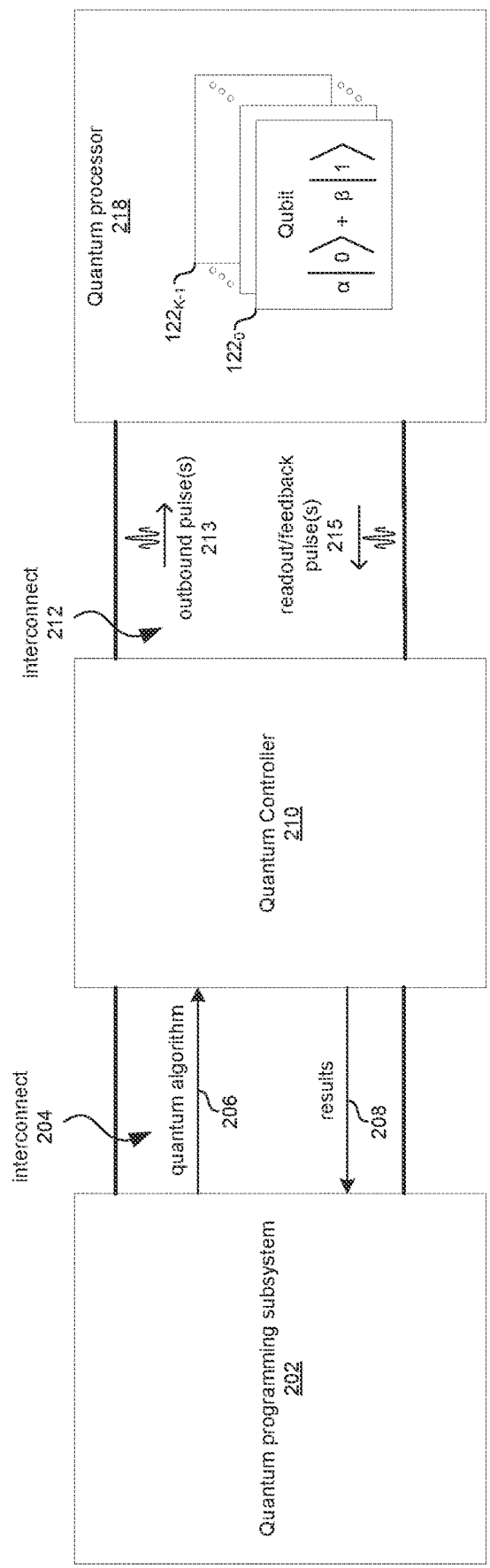
FIG. 2 shows an example quantum computing system.

FIG. 2 shows an example quantum computing system. The system comprises a quantum programming subsystem 202, a quantum controller 210, and a quantum processor 218.

The quantum programming subsystem 202 comprises circuitry operable to generate a quantum algorithm description 206 which the quantum controller 210 can execute to carry out the quantum algorithm on the quantum processor 218 (i.e., generate the necessary outbound quantum pulse(s) 213) with little or no human intervention during runtime of the algorithm. In an example implementation, the quantum programming system 202 is a personal computer having installed on it a quantum controller software development kit (SDK) that enables a user to generate the quantum algorithm description 206 using a programming language. In an example implementation, the programming language may be a low-level language which has little or no abstraction from the instruction set used by the specific hardware of the quantum controller 210. Such instructions may be converted to machine code of the quantum controller 210 without need of a compiler or interpreter. In an example implementation, the programming language may be a high-level language which is much more abstracted from the particular hardware of the quantum controller 210. Such instructions may be compiled into machine code before they can be run on the quantum controller 210. In an example implementation the description 206 may be a machine code description of the quantum algorithm. In an example implementation, the description 206 may be a high-level description which the quantum controller 210 may itself compile into machine code. In an example implementation, the description 206 may be a high-level description which the quantum controller 210 may interpret into machine code during runtime. In an example implementation, an operating system or other software layer may run on the quantum controller 210 and the quantum algorithm description 206 may be software instructions that make use of an application programming interface (API) of the software running on the quantum controller 210.

The quantum programming subsystem 202 is coupled to the quantum controller 210 via interconnect 204 which may, for example, utilize universal serial bus (USB), peripheral component interconnect (PCIe) bus, wired or wireless Ethernet, or any other suitable communication protocol.

The quantum controller 210 comprises circuitry operable to load the quantum algorithm description 206 and then perform the quantum algorithm as per the quantum algorithm description 206. In an example implementation, quantum algorithm description 206 is machine code (i.e., series of binary vectors that represent instructions that the quantum controller's hardware can interpret and execute directly) which is loaded into the quantum controller 210. Then, execution of the machine code by the quantum controller 210 causes the quantum controller 210 to generate the necessary outbound quantum control pulse(s) 213 that correspond to the desired operations to be performed on the quantum processor 218 (e.g., sent to qubit(s) for manipulating a state of the qubit(s) or to readout resonator(s) for reading the state of the qubit(s), etc.). Depending on the quantum algorithm to be performed, outbound pulse(s) 213 for carrying out the algorithm may be predetermined at design time and/or may need to be determined during runtime. The runtime determination of the pulses may comprise performance of classical calculations and processing in the quantum controller 210 and/or the quantum programing subsystem 202 during runtime of the algorithm (e.g., runtime analysis of inbound pulses 215 received from the quantum processor 218).

Upon completion of a quantum algorithm and/or during a runtime of a quantum algorithm by the quantum controller 210, the quantum controller 210 may output data/results 208 to the quantum programming subsystem 202. In an example implementation these results may be used to generate a new quantum algorithm description 206 for a subsequent run of the quantum algorithm and/or update the quantum algorithm description during runtime.

The quantum controller 210 is coupled to the quantum processor 218 via interconnect 212 which may comprise, for example, one or more conductors and/or optical fibers.

The quantum processor 218 comprises K (an integer) quantum elements 122, which includes qubits (which could be of any type such as superconducting, spin qubits, ion trapped, etc.), and, where applicable, any other element(s) for processing quantum information, storing quantum information (e.g. storage resonator), and/or coupling the outbound quantum control pulses 213 and inbound quantum control pulses 215 between interconnect 212 and the quantum element(s) 122 (e.g., readout resonator(s)). In an example implementation in which the quantum processor comprises readout resonators (or other readout circuitry) K may be equal the total number of qubits plus the number of readout circuits. That is, if each of Q (an integer) qubits of the quantum processor 218 is associated with a dedicated readout circuit, then K may be equal to 2Q. For ease of description, the remainder of this disclosure will assume such an implementation, but it need not be the case in all implementations. Other elements of the quantum processor 218 may include, for example, flux lines (electronic lines for carrying current), gate electrodes (electrodes for voltage gating), current/voltage lines, amplifiers, classical logic circuits residing on-chip in the quantum processor 218, and/or the like.

Figure 3A:
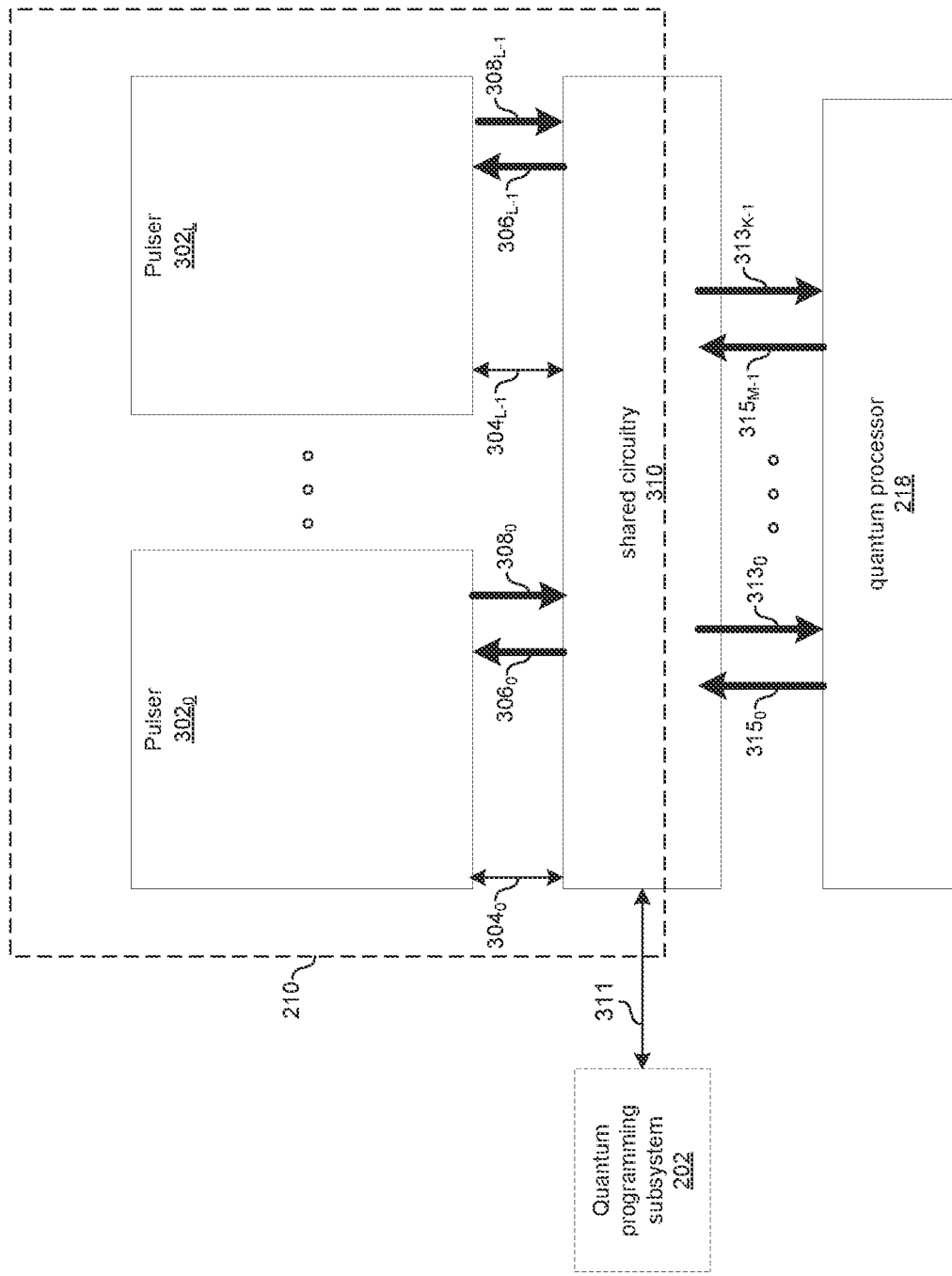
FIG. 3A shows an example quantum controller architecture in accordance with various example implementations of this disclosure.

FIG. 3A shows an example quantum controller architecture in accordance with various example implementations of this disclosure. The quantum controller 210 comprises L (an integer ≥1) pulser circuits $302_0$-$302_{L-1}$ and shared circuitry 310.

In the example implementation shown, each pulser circuit $302_l$ (l an integer between 0 and L−1) comprises circuitry for exchanging information over signal paths $304_l$, $306_l$, and $308_l$, where the signal path $308_l$ carries outbound pulses (e.g., 213 of FIG. 2) generated by the pulser circuit $302_l$ (which may be, for example, control pulses sent to the quantum processor 128 to manipulate one or more properties of one or more quantum elements—e.g., manipulate a state of one or more qubits, manipulate a frequency of a qubit using flux biasing, etc., and/or readout a state of one or more quantum elements), the signal path $306_l$ carries inbound quantum element readout pulses (e.g., 215 of FIG. 2) to be processed by the pulser circuit $302_l$, and signal path $304_l$ carries control information. Each signal path may comprise one or more conductors, optical channels, and/or wireless channels.

Each pulser circuit $302_l$ comprises circuitry operable to generate outbound pulses on signal path $308_l$ according to quantum control operations to be performed on the quantum processor 218. This involves very precisely controlling characteristics such as phase, frequency, amplitude, and timing of the outbound pulses. The characteristics of an outbound pulse generated at any particular time may be determined, at least in part, on inbound pulses received from the quantum processor 218 (via shared circuitry 310 and signal path $306_l$) at a prior time. In an example implementation, the time required to close the feedback loop (i.e., time from receiving a first pulse on one or more of paths $315_1$-$315_L$ (e.g., at an analog to digital converter of the path) to sending a second pulse on one or more of paths $313_0$-$313_{L-1}$ (e.g., at an output of a digital-to-analog converter of the path), where the second pulse is based on the first pulse) is significantly less than the coherence time of the qubits of the quantum processor 218. For example, the time to close the feedback loop may be on the order of 100 nanoseconds. It should be noted that each signal path in FIG. 3A may in practice be a set of signal paths for supporting generation of multi-pulse sets (e.g., two signal paths for two-pulse pairs, three signal paths for three-pulse sets, and so on).

In the example implementation shown, the shared circuitry 310 comprises circuitry for exchanging information with the pulser circuits $302_0$-$302_{L-1}$ over signal paths $304_0$-$304_{L-1}$, $306_0$-$306_{L-1}$, and $308_0$-$308_{L-1}$, where each signal path $308_l$ carries outbound pulses generated by the pulser circuit $302_l$, each signal path $306_l$ carries inbound pulses to be processed by pulser circuit $302_l$, and each signal path $304_l$ carries control information such as flag/status signals, data read from memory, data to be stored in memory, data streamed to/from the quantum programming subsystem 202, and data to be exchanged between two or more pulsers $302_0$-$302_L$. Similarly, in the example shown the shared circuitry 310 comprises circuitry for exchanging information with the quantum processor 218 over signal paths $315_0$-$315_{M-1}$ and $313_1$-$313_{K-1}$, where each signal path $315_m$ (m an integer between 0 and M−1) carries inbound pulses from the quantum processor 218, and each signal path $313_k$ (k an integer between 0 and K−1) carries outbound pulses to the quantum processor 218. Additionally, in the example shown the shared circuitry 310 comprises circuitry for exchanging information with the quantum programming subsystem over signal path 311. The shared circuitry 310 may be: integrated with the quantum controller (e.g., on the same field programmable gate array or application specific integrated circuitry or printed circuit board); external to the quantum controller (e.g., on a separate FPGA, ASIC, or PCB connected to the quantum controller via one or more cables, backplanes, in other devices connected to the quantum processor 218, etc.); or partially integrated with the quantum controller and partially external to the quantum controller.

In various implementations, M may be less than, equal to, or greater than L, K may be less than, equal to, or greater than L, and M may be less than, equal to, or greater than K. For example, the nature of some quantum algorithms is such that not all K quantum elements need to be driven at the same time. For such algorithms, L may be less than K and one or more of the L pulsers $302_l$ may be shared among multiple of the K quantum elements circuits. That is, any pulser $302_l$ may generate pulses for different quantum elements at different times. This ability of a pulser $302_l$ to generate pulses for different quantum elements at different times can reduce the number of pulsers $302_0$-$302_{L-1}$ (i.e., reduce L) required to support a given number of quantum elements (thus saving significant resources, cost, size, overhead when scaling to larger numbers of qubits, etc.).

The ability of a pulser $302_l$ to generate pulses for different quantum elements at different times also enables reduced latency. As just one example, assume a quantum algorithm which needs to send a pulse to quantum element $122_0$ at time T1, but whether the pulse is to be of a first type or second type (e.g., either an X pulse or a Hadamard pulse) cannot be determined until after processing an inbound readout pulse at time T1-DT (i.e., DT time intervals before the pulse is to be output). If there were a fixed assignment of pulsers $302_0$-$302_{L-1}$ to quantum elements of the quantum processor 218 (i.e., if $302_0$ could only send pulses to quantum element $122_0$, and $302_1$ could only send pulses to quantum element $122_1$, and so on), then pulser $302_0$ might not be able to start generating the pulse until it determined what the type was to be. In the depicted example implementation, on the other hand, pulser $302_0$ can start generating the first type pulse and pulser $302_1$ can start generating the second type pulse and then either of the two pulses can be released as soon as the necessary type is determined. Thus, if the time to generate the pulse is $T_{lat}$, in this example the example quantum controller 210 may reduce latency of outputting the pulse by $T_{lat}$.

The shared circuitry 310 is thus operable to receive pulses via any one or more of the signals paths $308_0$-$308_{L-1}$ and/or $315_0$-$315_{M-1}$, process the received pulses as necessary for carrying out a quantum algorithm, and then output the resulting processed pulses via any one or more of the signal paths $306_0$-$306_{L-1}$ and/or $313_0$-$313_{K-1}$. The processing of the pulses may take place in the digital domain and/or the analog domain. The processing may comprise, for example: frequency translation/modulation, phase translation/modulation, frequency and/or time division multiplexing, time and/or frequency division demultiplexing, amplification, attenuation, filtering in the frequency domain and/or time domain, time-to-frequency-domain or frequency-to-time-domain conversion, upsampling, downsampling, and/or any other signal processing operation. At any given time, the decision as to from which signal path(s) to receive one or more pulse(s), and the decision as to onto which signal path(s) to output the pulse(s) may be: predetermined (at least in part) in the quantum algorithm description; and/or dynamically determined (at least in part) during runtime of the quantum algorithm based on classical programs/computations performed during runtime, which may involve processing of inbound pulses. As an example of predetermined pulse generation and routing, a quantum algorithm description may simply specify that a particular pulse with predetermined characteristics is to be sent to signal path $313_1$ at a predetermined time. As an example of dynamic pulse determination and routing, a quantum algorithm description may specify that an inbound readout pulse at time T-DT should be analyzed and its characteristics (e.g., phase, frequency, and/or amplitude) used to determine, for example, whether at time T pulser $302_l$ should output a pulse to a first quantum element or to a second quantum element or to determine, for example, whether at time T pulser $302_l$ should output a first pulse to a first quantum element or a second pulse to the first quantum element. In various implementations of the quantum controller 210, the shared circuitry 310 may perform various other functions instead of and/or in addition to those described above. In general, the shared circuitry 310 may perform functions that are desired to be performed outside of the individual pulser circuits $302_0$-$302_{L-1}$. For example, a function may be desirable to implement in the shared circuitry 310 where the same function is needed by a number of pulser circuits from $302_0$-$302_{L-1}$ and thus may be shared among these pulser circuits instead of redundantly being implemented inside each pulser circuit. As another example, a function may be desirable to implement in the shared circuitry 310 where the function is not needed by all pulser circuits $302_0$-$302_{L-1}$ at the same time and/or on the same frequency and thus fewer than L circuits for implementing the function may be shared among the L pulser circuits $302_0$-$302_{L-1}$ through time and/or frequency division multiplexing. As another example, a function may be desirable to implement in the shared circuitry 310 where the function involves making decisions based on inputs, outputs, and/or state of multiple of the L pulser circuits $302_0$-$302_{L-1}$, or other circuits. Utilizing a centralized coordinator/decision maker in the shared circuitry 310 may have the benefit(s) of: (1) reducing pinout and complexity of the pulser circuits $302_0$-$302_{L-1}$; and/or (2) reducing decision-making latency. Nevertheless, in some implementations, decisions affecting multiple pulser circuits $302_0$-$302_{L-1}$ may be made by one or more of the pulser circuits $302_0$-$302_{L-1}$ where the information necessary for making the decision can be communicated among pulser circuits within a suitable time frame (e.g., still allowing the feedback loop to be closed within the qubit coherence time) over a tolerable number of pins/traces.

Figure 3B:
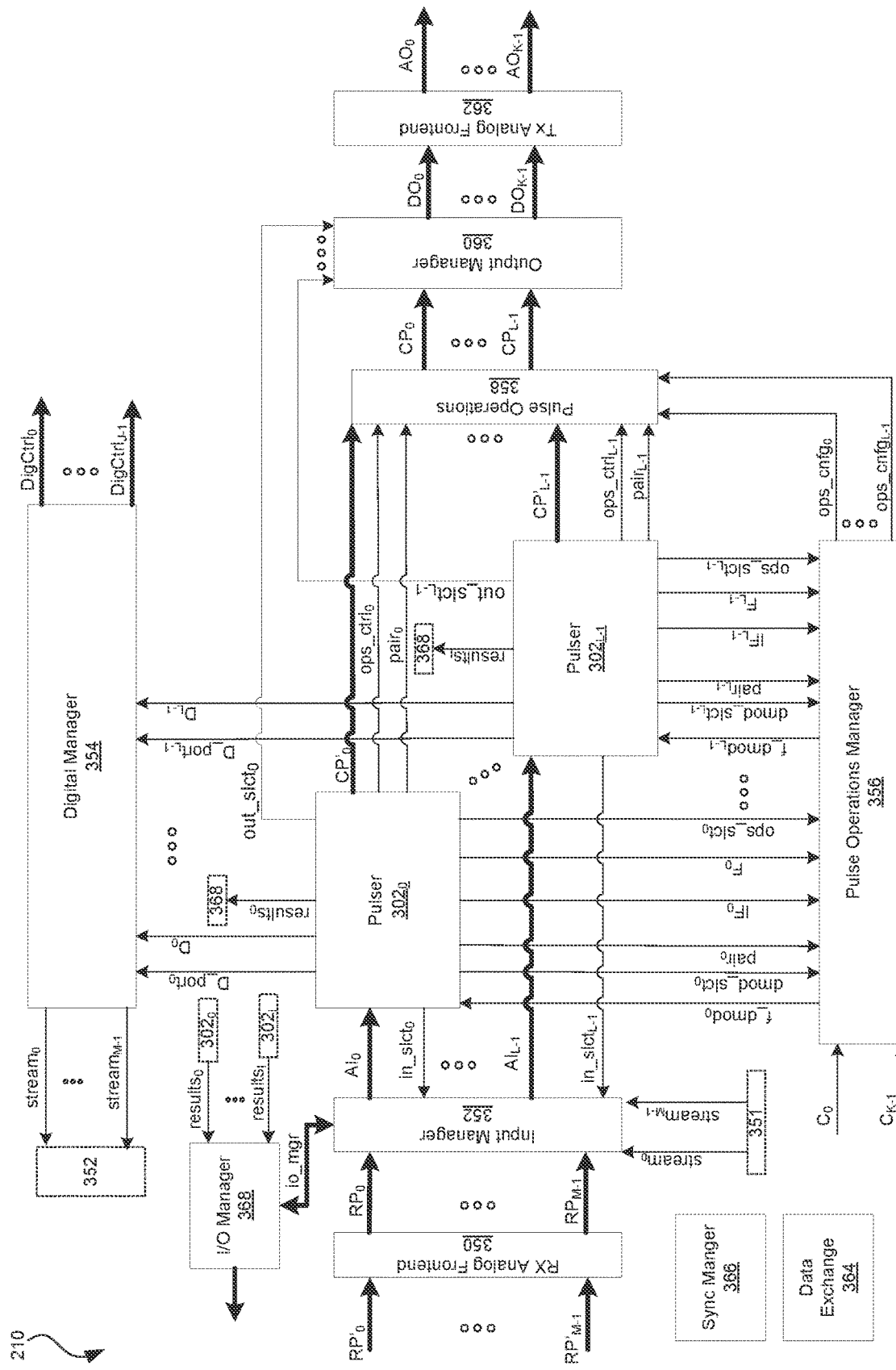
FIG. 3B shows an example implementation of the quantum controller circuitry of FIG. 3A.

FIG. 3B shows an example implementation of the quantum controller of FIG. 2. The example quantum controller shown comprises pulsers $302_1$-$302_{L-1}$, receive analog frontend 350, input manager 352, digital manager 354, pulse operations manager 356, pulse operations 358, output manager 360, transmit analog frontend 362, data exchange 364, synchronization manager 366, and input/output ("I/O") manager 368. Circuitry depicted in FIG. 3B other than pulser circuits $302_0$-$302_{L-1}$ corresponds to an example implementation of the shared circuitry 310 of FIG. 3A.

The receive analog frontend 350 comprises circuitry operable to concurrently process up to M (an integer ≥1) analog inbound signals (RP'$_0$-RP'$_{M-1}$) received via signal paths $315_0$-$315_{M-1}$ to generate up to M concurrent inbound signals (RP$_0$-RP$_{M-1}$) to be output to input manager 352 via one or more signal paths. Although there is shown to be M signals RP and M signals RP', this need not be the case. Such processing may comprise, for example, analog-to-digital conversion, filtering, upconversion, downconversion, amplification, attenuation, time division multiplexing/demultiplexing, frequency division multiplexing/demultiplexing, and/or the like. In various implementations, M may be less than, equal to, or greater than L and M may be less than, equal to, or greater than K.

The input manager 352 comprises circuitry operable to route any one or more of signals (RP$_0$-RP$_{M-1}$) to any one or more of pulsers $302_0$-$302_{L-1}$ (as signal(s) Al$_0$-Al$_{L-1}$) and/or to other circuits (e.g. as signal io_mgr to I/O manager 368). In an example implementation, the input manager 352 comprises one or more switch networks, multiplexers, and/or or the like for dynamically reconfiguring which signals RP$_0$-RP$_{M-1}$ are routed to which pulsers $302_0$-$302_{L-1}$. This may enable time division multiplexing multiple of the signals RP$_0$-RP$_{M-1}$ onto a single signal Al$_l$ and/or time division demultiplexing components (e.g., time slices) of a signal RP$_m$ onto multiple of the signals Al$_0$-Al$_{L-1}$. In an example implementation, the input manager 352 comprises one or more mixers and/or filters for frequency division multiplexing multiple of the signals RP$_0$-RP$_{M-1}$ onto a single signal Al$_l$ and/or frequency division demultiplexing components (e.g., frequency bands) of a signal RP$_m$ onto multiple of the signals Al$_0$-Al$_{L-1}$. The signal routing and multiplexing/demultiplexing functions performed by the input manager 352 enables: a particular pulser $302_l$ to process different inbound pulses from different quantum elements at different times; a particular pulser $302_l$ to process different inbound pulses from different quantum elements at the same time; and multiple of the pulsers $302_0$-$302_{L-1}$ to processes the same inbound pulse at the same time. In the example implementation shown, routing of the signals RP$_0$-RP$_{M-1}$ among the inputs of the pulsers $302_0$-$302_{L-1}$ is controlled by digital control signals in_slct$_0$-in_slct$_{L-1}$ from the pulsers $302_0$-$302_{L-1}$. In another implementation, the input manager may be operable to autonomously determine the appropriate routing (e.g., where the quantum algorithm description includes instructions to be loaded into memory of, and executed by, the input manager 352). In the example implementation, the input manager 352 is operable to rout input signals RP$_0$-RP$_{M-1}$ to the I/O manager 368 (as signal(s) io_mgr), to be sent to the quantum programing subsystem 202. This routing may, for example, be controlled by signals from the digital manager 354. In an example implementation, for each input signal RP$_m$ there is a digital signal, stream$_m$, from the digital manager 354 to the input manager 352 that controls whether RP$_m$ will be sent from the input manager 352 to the i/O manager 368 and from there to the quantum programing subsystem 202.

Each of the pulsers $302_0$-$302_{L-1}$ is as described above with reference to FIG. 3A. In the example implementation shown, each pulser $302_l$ is operable to generate raw outbound pulses CP'$_l$ ("raw" is used simply to denote that the pulse has not yet been processed by pulse operations circuitry 358) and digital control signals in_slct$_l$, D_port$_l$, D$_l$, out_slct$_l$, ops_ctrl$_l$, ops_slct$_l$, IF$_l$, F$_l$, and dmod_sclt$_l$ for carrying out quantum algorithms on the quantum processor 218, and results$_l$ for carrying intermediate and/or final results generated by the pulser $302_l$ to the quantum programming subsystem 202. One or more of the pulsers $302_0$-$302_{L-1}$ may receive and/or generate additional signals which are not shown in FIG. 3A for clarity of illustration. The raw outbound pulses CP'$_0$-CP'$_{L-1}$ are conveyed via signal paths $308_0$-$308_{L-1}$ and the digital control signals are conveyed via signal paths $304_0$-$304_{L-1}$. Each of the pulsers $302_l$ is operable to receive inbound pulse signal Al$_l$ and signal f_dmod$_l$. Pulser $302_l$ may process the inbound signal Al$_l$ to determine the state of certain quantum element(s) in the quantum processor 218 and use this state information for making decisions such as, for example, which raw outbound pulse CP'$_l$ to generate next, when to generate it, and what control signals to generate to affect the characteristics of that raw outbound pulse appropriately. Pulser $302_l$ may use the signal f_dmod$_l$ for determining how to process inbound pulse signal Al$_l$. As an example, when pulser $302_1$ needs to process an inbound signal Al$_1$ from quantum element $122_3$, it can send a dmod_sclt$_1$ signal that directs pulse operations manager 356 to send, on f_dmod$_1$, settings to be used for demodulation of an inbound signal AI$_1$ from quantum element 122$_3$ (e.g., the pulse operations manager 356 may send the value $\cos(\omega_3 * TS * T_{clk1} + \phi_3)$, where $\omega_3$ is the frequency of quantum element 122$_3$, TS is amount of time passed since the reference point, for instance the time at which quantum algorithm started running, and $\phi_3$ is the phase of the total frame rotation of quantum element 122$_3$, i.e. the accumulated phase of all frame rotations since the reference point).

The pulse operations circuitry 358 is operable to process the raw outbound pulses CP'$_0$-CP'$_{L-1}$ to generate corresponding output outbound pulses CP$_0$-CP$_{L-1}$. This may comprise, for example, manipulating the amplitude, phase, and/or frequency of the raw pulse CP'$_l$. The pulse operations circuitry 358 receives raw outbound pulses CP'$_0$-CP'$_{L-1}$ from pulsers 302$_0$-302$_{L-1}$, control signals ops_cnfg$_0$-ops_cnfg$_{L-1}$ from pulse operations manager 356, and ops_ctrl$_0$-ops_ctrl$_{L-1}$ from pulsers 302$_0$-302$_{L-1}$.

The control signal ops_cnfg$_l$ configures, at least in part, the pulse operations circuitry 358 such that each raw outbound pulse CP'$_l$ that passes through the pulse operations circuitry 358 has performed on it one or more operation(s) tailored for that particular pulse. To illustrate, denoting a raw outbound pulse from pulser 302$_3$ at time T1 as CP'$_{3,T1}$, then, at time T1 (or sometime before T1 to allow for latency, circuit setup, etc.), the digital control signal ops_cnfg$_3$ (denoted ops_cnfg$_{3,T1}$ for purposes of this example) provides the information (e.g., in the form of one or more matrix, as described below) as to what specific operations are to be performed on pulse CP'$_{3,T1}$. Similarly, ops_cnfg$_{4,T1}$ provides the information as to what specific operations are to be performed on pulse CP'$_{4,T1}$, and ops_cnfg$_{3,T2}$ provides the information as to what specific operations are to be performed on pulse CP'$_{4,T1}$.

The control signal ops_ctrl$_l$ provides another way for the pulser 302$_l$ to configure how any particular pulse is processed in the pulse operations circuitry 358. This may enable the pulser 302$_l$ to, for example, provide information to the pulse operation circuitry 358 that does not need to pass through the pulse operation manager 356. For example, the pulser 302$_l$ may send matrix values calculated in real-time by the pulser 302$_l$ to be used by the pulse operation circuitry 358 to modify pulse CP'$_l$. These matrix values arrive to the pulse operation circuitry 358 directly from the pulser 302$_l$ and do not need to be sent to the pulse operation manager first. Another example may be that the pulser 302$_l$ provides information to the pulse operation circuitry 358 to affect the operations themselves (e.g. the signal ops_ctrl$_l$ can choose among several different mathematical operations that can be performed on the pulse).

The pulse operations manager 356 comprises circuitry operable to configure the pulse operations circuitry 358 such that the pulse operations applied to each raw outbound pulse CP'$_l$ are tailored to that particular raw outbound pulse. To illustrate, denoting a first raw outbound pulse to be output during a first time interval T1 as CP'$_{l,T1}$, and a second raw outbound pulse to be output during a second time interval T2 as CP'$_{l,T2}$, then pulse operations circuitry 358 is operable to perform a first one or more operations on CP'$_{l,T1}$ and a second one or more operations on CP'$_{l,T2}$. The first one or more operations may be determined, at least in part, based on to which quantum element the pulse CP$_{l,T1}$ is to be sent, and the second one or more operations may be determined, at least in part, based on to which quantum element the pulse CP$_{l,T2}$ is to be sent. The determination of the first one or more operations and second one or more operations may be performed dynamically during runtime.

The transmit analog frontend 362 comprises circuitry operable to concurrently process up to K digital signals DO$_k$ to generate up to K concurrent analog signals AO$_k$ to be output to the quantum processor 218. Such processing may comprise, for example, digital-to-analog conversion, filtering, upconversion, downconversion, amplification, attenuation, time division multiplexing/demultiplexing, frequency division multiplexing/demultiplexing and/or the like. In an example implementation, each of the one or more of signal paths 313$_0$-313$_{K-1}$ (FIG. 3A) represents a respective portion of Tx analog frontend circuit 362 as well as a respective portion of interconnect 212 (FIG. 2) between the Tx analog frontend circuit 362 and the quantum processor 218. Although there is one-to-one correspondence between the number of DO signals and the number of AO signals in the example implementation described here, such does not need to be the case. In another example implementation, the analog frontend 362 is operable to map more (or fewer) signals DO to fewer (or more) signals AO. In an example implementation the transmit analog frontend 362 is operable to process digital signals DO$_0$-DO$_{K-1}$ as K independent outbound pulses, as K/2 two-pulse pairs, or process some of signals DO$_0$-DO$_{K-1}$ as independent outbound pulses and some signals DO$_0$-DO$_{K-1}$ as two-pulse pairs (at different times and/or concurrently).

The output manager 360 comprises circuitry operable to route any one or more of signals CP$_0$-CP$_{L-1}$ to any one or more of signal paths 313$_0$-313$_{K-1}$. As just one possible example, signal path 313$_0$ may comprise a first path through the analog frontend 362 (e.g., a first mixer and DAC) that outputs AO$_0$ and traces/wires of interconnect 212 that carry signal AO$_0$; signal path 313$_1$ may comprise a second path through the analog frontend 362 (e.g., a second mixer and DAC) that outputs AO$_1$ and traces/wires of interconnect 212 that carry signal AO$_1$, and so on. In an example implementation, the output manager 360 comprises one or more switch networks, multiplexers, and/or the like for dynamically reconfiguring which one or more signals CP$_0$-CP$_{L-1}$ are routed to which signal paths 313$_0$-313$_{K-1}$. This may enable time division multiplexing multiple of the signals CP$_0$-CP$_{L-1}$ onto a single signal path 313$_k$ and/or time division demultiplexing components (e.g., time slices) of a signal CP$_m$ onto multiple of the signal paths 313$_0$-313$_{K-1}$. In an example implementation, the output manager 360 comprises one or more mixers and/or filters for frequency division multiplexing multiple of the signals CP$_0$-CP$_{M-1}$ onto a single signal path 313$_k$ and/or frequency division demultiplexing components (e.g., frequency bands) of a signal CP$_m$ onto multiple of the signal paths 313$_0$-313$_{K-1}$. The signal routing and multiplexing/demultiplexing functions performed by the output manager 360 enables: routing outbound pulses from a particular pulser 302$_l$ to different ones of the signal paths 313$_0$-313$_{K-1}$ at different times; routing outbound pulses from a particular pulser 302$_l$ to multiple of the signal paths 313$_0$-313$_{K-1}$ at the same time; and multiple of the pulsers 302$_0$-302$_{L-1}$ generating pulses for the same signal path 313$_k$ at the same time. In the example implementation shown, routing of the signals CP$_0$-CP$_{L-1}$ among the signal paths 313$_0$-313$_{K-1}$ is controlled by digital control signals out_slct$_0$-out_slct$_{L-1}$ from the pulsers 302$_0$-302$_{L-1}$. In another implementation, the output manager 360 may be operable to autonomously determine the appropriate routing (e.g., where the quantum algorithm description includes instructions to be loaded into memory of, and executed by, the output manager 360). In an example implementation, at any given time, the output manager 360 is operable to concurrently route K of the digital signals $CP_0$-$CP_{L-1}$ as K independent outbound pulses, concurrently route K/2 of the digital signals $CP_0$-$CP_{L-1}$ as two-pulse pairs, or route some of signals $CP_0$-$CP_{L-1}$ as independent outbound pulses and some others of the signals $CP_0$-$CP_{L-1}$ as multi-pulse sets (at different times and/or concurrently).

The digital manager 354 comprises circuitry operable to process and/or route digital control signals ($DigCtrl_0$-$DigCtrl_{J-1}$) to various circuits of the quantum controller 210 and/or external circuits coupled to the quantum controller 210. In the example implementation shown, the digital manager receives, from each pulser $302_l$, (e.g., via one or more of signal paths $304_0$-$304_{N-1}$) a digital signal Di that is to be processed and routed by the digital manager 354, and a control signal $D\_port_l$ that indicates to which output port(s) of the digital manager 354 the signal Di should be routed. The digital control signals may be routed to, for example, any one or more of circuits shown in FIG. 3B, switches/gates which connect and disconnect the outputs $AO_0$-$AO_{K-1}$ from the quantum processor 218, external circuits coupled to the quantum controller 210 such as microwave mixers and amplifiers, and/or any other circuitry which can benefit from on real-time information from the pulser circuits $302_0$-$302_{L-1}$. Each such destination of the digital signals may require different operations to be performed on the digital signal (such as delay, broadening, or digital convolution with a given digital pattern). These operations may be performed by the digital manager 354 and may be specified by control signals from the pulsers $302_0$-$302_{L-1}$. This allows each pulser $302_l$ to generate digital signals to different destinations and allows different ones of pulsers $302_0$-$302_{L-1}$ to generate digital signals to the same destination while saving resources.

The synchronization manager 366 comprises circuitry operable to manage synchronization of the various circuits shown in FIG. 3B. Such synchronization is advantageous in a modular and dynamic system, such as quantum controller 210, where different ones of pulsers $302_0$-$302_{L-1}$ generate, receive, and process pulses to and from different quantum elements at different times. For example, while carrying out a quantum algorithm, a first pulser circuit $302_1$ and a second pulser circuit $302_2$ may sometimes need to transmit pulses at precisely the same time and at other times transmit pulses independently of one another. In the example implementation shown, the synchronization manager 366 reduces the overhead involved in performing such synchronization.

The data exchange circuitry 364 is operable to manage exchange of data among the various circuits shown in FIG. 3B. For example, while carrying out a quantum algorithm, first pulser circuit $302_1$ and a second pulser circuit $302_2$ may sometimes need to exchange information. As just one example, pulser $302_1$ may need to share, with pulser $302_2$, the characteristics of an inbound signal $AI_1$ that it just processed so that pulser $302_2$ can generate a raw outbound pulse $CP'_2$ based on the characteristics of $AI_1$. The data exchange circuitry 364 may enable such information exchange. In an example implementation, the data exchange circuitry 364 may comprise one or more registers to and from which the pulsers $302_0$-$302_{L-1}$ can read and write.

The I/O manager 368 is operable to route information between the quantum controller 210 and the quantum programming subsystem 202.

Figure 4:
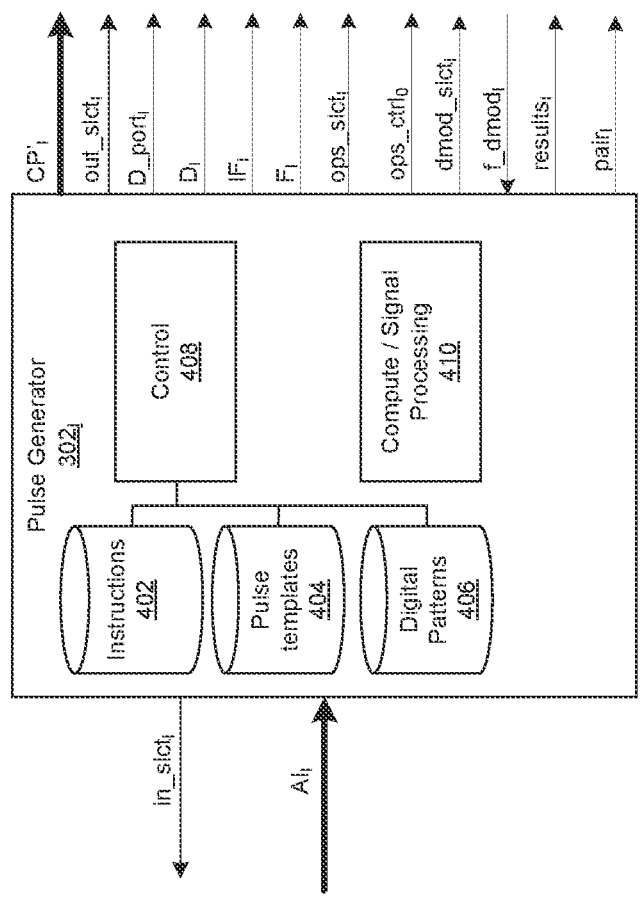
FIG. 4 shows an example implementation of the pulser of FIG. 3B.

FIG. 4 shows an example implementation of the pulser of FIG. 3B. The example pulser $302_l$ shown comprises instruction memory 402, pulse template memory 404, digital pattern memory 406, control circuitry 408, and compute and/or signal processing circuitry (CSP) 410.

The memories 402, 404, 406 may comprise one or more be any type of suitable storage elements (e.g., DRAM, SRAM, Flash, etc.). The instructions stored in memory 402 are instructions to be executed out by the pulser $302_l$ for carrying out its role in a quantum algorithm. Because different pulsers $302_0$-$302_{L-1}$ have different roles to play in any particular quantum algorithm (e.g., generating different pulses at different times), the instructions memory 402 for each pulser $302_l$ may be specific to that pulser. For example, the quantum algorithm description 206 from the quantum programming subsystem 202 may comprise a first set of instructions to be loaded (via I/O manager 368) into pulser $302_0$, a second set of instructions to be loaded into pulser $302_1$, and so on. Each pulse template stored in memory 404 comprises a sequence of one or more samples of any arbitrary shape (e.g., Gaussian, sinc, impulse, etc.) representing the pulses to be sent to pulse operation circuitry 358. Each digital pattern stored in memory 406 comprises a sequence of one or more binary values which may represent the digital pulses to be sent to the digital manager 354 for generating digital control signals $DigCtrl_0$-$DigCtrl_{J-1}$.

The control circuitry 408 is operable to execute the instructions stored in memory 402 to process inbound signal $AI_l$, generate raw outbound pulses $CP'_l$, and generate digital control signals $in\_slct_l$, $out\_slct_l$, $D\_port_l$, $D_l$, $IF_l$, $F_l$, $ops\_slct_l$, $ops\_ctrl_l$, $results_l$, $dmod\_slct_l$ and $pair_l$. In the example implementation shown, the processing of the inbound signal $AI_l$ is performed by the CSP circuitry 410 and based (at least in part) on the signal $f\_dmod_l$.

The compute and/or signal processing circuitry (CSP) 410 is operable to perform computational and/or signal processing functions, which may comprise, for example Boolean-algebra based logic and arithmetic functions and demodulation (e.g., of inbound signals $AI_l$).

In operation of an example implementation, generation of a raw outbound pulse $CP'_l$ comprises the control circuitry 408: (1) determining a pulse template to retrieve from memory 404 (e.g., based on a result of computations and/or signal processing performed by the CSP 410); (2) retrieving the pulse template; (3) performing some preliminary processing on the pulse template; (4) determining the values of F, IF, $pair_l$, $ops\_slct_l$, and $dmod\_slct_l$ to be sent to the pulse operation manager 356 (as predetermined in the quantum algorithm description and/or determined dynamically based on results of computations and/or signal processing performed by the CSP 410); (5) determining the value of $ops\_ctrl_l$ to be sent to the pulse operation circuitry 358; (6) determining the value of $in\_slct_l$ to be sent to the input manager 352; (7) determining a digital pattern to retrieve from memory 406 (as predetermined in the quantum algorithm description and/or determined dynamically based on results of computations and/or signal processing performed by the CSP 410); (8) outputting the digital pattern as Di to the digital manager along with control signal $D\_port_l$ (as predetermined in the quantum algorithm description and/or determined dynamically based on results of computations and/or signal processing performed by the CSP 410); (9) outputting the raw outbound pulse $CP'_l$ to the pulse operations circuitry 358; (10) outputting $results_l$ to the I/O manager.

Figure 5:
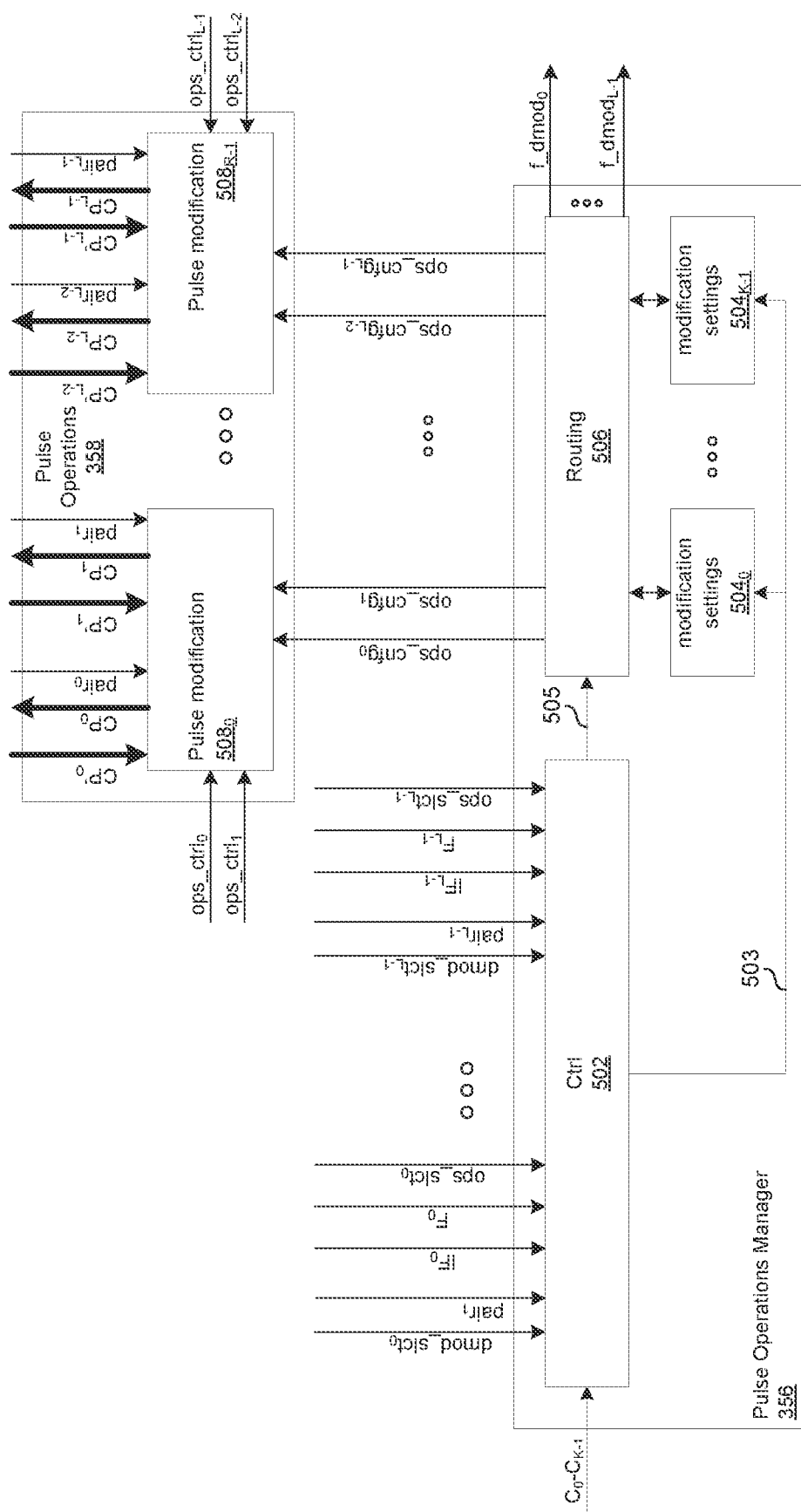
FIG. 5 shows an example implementation of the pulse operations manager and pulse operations circuitry of FIG. 3B.

FIG. 5 shows an example implementation of the pulse operations manager and pulse operations circuitry of FIG. 3B. The pulse operations circuitry 358 comprises a plurality of pulse modification circuits $508_0$-$508_{R-1}$ (R is an integer ≥1 in general, and R=L/2 in the example shown). The pulse operations manager 356 comprises control circuitry 502, routing circuitry 506, and a plurality of modification settings circuits $504_0$-$504_{K-1}$.

Although the example implementation has a 1-to-2 correspondence between pulse modification circuits $508_0$-$508_{R-1}$ and pulser circuits $302_0$-$302_{L-1}$, that does not need to be the case. In other implementations there may be fewer pulse modification circuits 508 than pulser circuits 302. Similarly, other implementations may comprise more pulse modification circuits 508 than pulser circuits 302.

As an example, in some instances, two of the pulsers $302_0$-$302_{L-1}$ may generate two raw outbound pulses which are a phase-quadrature pulse pair. For example, assuming $CP_1$ and $CP_2$ are a phase-quadrature pulse pair to be output on path $313_3$. In this example, pulse operations circuitry 358 may process $CP_1$ and $CP_2$ by multiplying a vector representation of $CP'_1$ and $CP'_2$ by one or more 2 by 2 matrices to: (1) perform single-sideband-modulation, as given by $$\begin{pmatrix} CP_1 \\ CP_2 \end{pmatrix} = \begin{pmatrix} \cos(\omega * TS * T_{clck1}) & -\sin(\omega * TS * T_{clck1}) \\ \sin(\omega * TS * T_{clck1}) & \cos(\omega * TS * T_{clck1}) \end{pmatrix} \begin{pmatrix} CP'_1 \\ CP'_2 \end{pmatrix},$$

where ω is the frequency of the single side band modulation and TS is the time passed since the reference time (e.g. the beginning of a certain control protocol); (2) keep track of frame-of-reference rotations, as given by $$\begin{pmatrix} CP_1 \\ CP_2 \end{pmatrix} = \begin{pmatrix} \cos(\phi) & -\sin(\phi) \\ \sin(\phi) & \cos(\phi) \end{pmatrix} \begin{pmatrix} CP'_1 \\ CP'_2 \end{pmatrix},$$

where ϕ is the total phase that the frame of reference accumulated since the reference time; and/or (3) perform an IQ-mixer correction $$\begin{pmatrix} CP_1 \\ CP_2 \end{pmatrix} = \begin{pmatrix} C_{00} & C_{01} \\ C_{10} & C_{11} \end{pmatrix} \begin{pmatrix} CP'_1 \\ CP'_2 \end{pmatrix},$$

where $C_{00}$, $C_{01}$, $C_{10}$, and $C_{11}$ are the elements of a matrix that corrects for IQ-mixer imperfections. In an example implementation, each modification settings circuit, $504_k$, contains registers that contain the matrix elements of three matrices:

$$C_k = \begin{pmatrix} C_{k00} & C_{k01} \\ C_{k10} & C_{k11} \end{pmatrix},$$

an IQ-mixer correction matrix;

$$; S_k = \begin{pmatrix} \cos(\omega_k * TS * T_{clck1}) & -\sin(\omega_k * TS) * T_{clck1} \\ \sin(\omega_k * TS * T_{clck1}) & \cos(\omega_k * TS * T_{clck1}) \end{pmatrix},$$

a single side band frequency modulation matrix; and $$F_k = \begin{pmatrix} \cos(\phi_k) & -\sin(\phi_k) \\ \sin(\phi_k) & \cos(\phi_k) \end{pmatrix},$$

a frame rotation matrix, which rotates the IQ axes around the axis perpendicular to the IQ plane (i.e. the z-axis if I and Q are the x-axis and y-axis). In an example implementation, each modification settings circuit $504_k$ also contains registers that contain the elements of the matrix products $C_k S_k F_k$ and $S_k F_k$.

In the example shown, each pulse modification circuit $508_r$ is operable to process two raw outbound pulses $CP'_{2r}$ and $CP'_{2r+1}$ according to: the modification settings ops_cnfg$_{2r}$ and ops_cnfg$_{2r+1}$; the signals ops_ctrl$_{2r}$ and ops_ctrl$_{2r+1}$; and the signals pair$_{2r}$ and pair$_{2r+1}$. In an example implementation pair$_{2r}$ and pair$_{2r+1}$ may be communicated as ops_ctrl$_{2r}$ and ops_ctrl$_{2r+1}$. The result of the processing is outbound pulses $CP_{2r}$ and $CP_{2r+1}$. Such processing may comprise adjusting a phase, frequency, and/or amplitude of the raw outbound pulses $CP'_{2r}$ and $CP'_{2r+1}$. In an example implementation, ops_cnfg$_{2r}$ and ops_cnfg$_{2r+1}$ are in the form of a matrix comprising real and/or complex numbers and the processing comprises matrix multiplication involving a matrix representation of the raw outbound pulses $CP_{2r}$ and $CP_{2r+1}$ and the ops_cnfg$_{2r}$ and ops_cnfg$_{2r+1}$ matrix.

The control circuitry 502 is operable to exchange information with the pulser circuits $302_0$-$302_{L-1}$ to generate values of ops_confg$_0$-ops_confg$_{L-1}$ and f_demod$_0$-f_demod$_{L-1}$, to control routing circuitry 506 based on signals ops_slct$_0$-ops_slct$_{L-1}$ and dmod_slct$_0$-dmod_slct$_{L-1}$, and to update pulse modification settings $504_0$-$504_{K-1}$ based on $IF_0$-$IF_{L-1}$ and $F_0$-$F_{L-1}$ such that pulse modification settings output to pulse operations circuitry 358 are specifically tailored to each raw outbound pulse (e.g., to which quantum element 222 the pulse is destined, to which signal path 313 the pulse is destined, etc.) to be processed by pulse operations circuitry 358.

Each modification settings circuit $504_k$ comprises circuitry operable to store modification settings for later retrieval and communication to the pulse operations circuitry 358. The modification settings stored in each modification settings circuit $504_k$ may be in the form of one or more two-dimensional complex-valued matrices. Each signal path $313_0$-$313_{K-1}$ may have particular characteristics (e.g., non-idealities of interconnect, mixers, switches, attenuators, amplifiers, and/or circuits along the paths) to be accounted for by the pulse modification operations. Similarly, each quantum element $122_0$-$122_k$ may have a particular characteristics (e.g. resonance frequency, frame of reference, etc.). In an example implementation, the number of pulse modification settings, K, stored in the circuits 504 corresponds to the number of quantum element $122_0$-$122_{K-1}$ and of signal paths $313_0$-$313_{K-1}$ such that each of the modification settings circuits $504_0$-$504_{K-1}$ stores modification settings for a respective one of the quantum elements $122_0$-$122_{K-1}$ and/or paths $313_0$-$313_{K-1}$. In other implementations, there may be more or fewer pulse modification circuits 504 than signal paths 313 and more or fewer pulse modification circuits 504 than quantum elements 122 and more or fewer signal paths 313 than quantum elements 122. The control circuitry 502 may load values into the modification settings circuit $504_0$-$504_{K-1}$ via signal 503.

The routing circuitry 506 is operable to route modification settings from the modification settings circuits $504_0$-$504_{L-1}$ to the pulse operations circuit 358 (as ops_confg$_0$-ops_confg$_{L-1}$) and to the pulsers $302_0$-$302_{L-1}$ (as f_dmod$_0$-f_dmod$_{L-1}$). In the example implementation shown, which of the modification settings circuits $504_0$-$504_{K-1}$ has its/their contents sent to which of the pulse modification circuits $508_0$-$508_{R-1}$ and to which of the pulsers $302_0$-$302_{L-1}$ is controlled by the signal 505 from the control circuitry 502.

The signal ops_slct$_l$ informs the pulse operations manager 356 as to which modification settings $504_k$ to send to the pulse modification circuit $508_l$. The pulser $302_l$ may determine ops_slct$_l$ based on the particular quantum element $122_k$ and/or signal path $313_k$ to which the pulse is to be transmitted (e.g., the resonant frequency of the quantum element, frame of reference, and/or mixer correction). The determination of which quantum element and/or signal path to which a particular pulser $302_l$ is to send an outbound pulse at a particular time may be predetermined in the quantum algorithm description or may be determined based on calculations performed by the pulser $302_l$ and/or others of the pulsers $302_0$-$302_{L-1}$ during runtime. The control circuitry 502 may then use this information to configure the routing block 506 such that the correct modification settings are routed to the correct one or more of the pulse modification circuits $508_0$-$508_{L-1}$.

In an example implementation, the digital signal IF$_l$ instructs the pulse operations manager 356 to update a frequency setting of the modification settings circuit $504_k$ indicated by ops_slct$_l$. In an example implementation, the frequency setting is the matrix $S_k$ (described above) and the signal IF$_l$ carries new values indicating the new $\omega_k$ to be used in the elements of the matrix $S_k$. The new values may, for example, be determined during a calibration routine (e.g., performed as an initial portion of the quantum algorithm) in which one or more of the pulsers $302_0$-$302_{L-1}$ sends a series of outbound pulses CP, each at a different carrier frequency, and then measures the corresponding inbound signals AI.

In an example implementation, the signal F$_l$ instructs the pulse operations manager 356 to update a frame setting of the modification settings circuit $504_k$ indicated by ops_slct$_l$. In an example implementation, the frame setting is the matrix $F_k$ (described above) and the signal F$_l$ carries a rotation matrix F$_l$ which multiplies with $F_k$ to rotate $F_k$. This can be written as $$F_k = F_1 F_k = \begin{pmatrix} \cos(\Delta\phi) & -\sin(\Delta\phi) \\ \sin(\Delta\phi) & \cos(\Delta\phi) \end{pmatrix} \begin{pmatrix} \cos(\phi_k) & -\sin(\phi_k) \\ \sin(\phi_k) & \cos(\phi_k) \end{pmatrix} = \begin{pmatrix} \cos(\phi_k + \Delta\phi) & -\sin(\phi_k + \Delta\phi) \\ \sin(\phi_k + \Delta\phi) & \cos(\phi_k + \Delta\phi) \end{pmatrix},$$

where $\phi_k$ is the frame of reference before the rotation and $\Delta\phi$ is the amount by which to rotate the frame of reference. The pulser $302_l$ may determine $\Delta\phi$ based on a predetermined algorithm or based on calculations performed by the pulsers $302_l$ and/or others of the pulsers $302_0$-$302_{L-1}$ during runtime.

In an example implementation, the signal dmod_sclt$_l$ informs the pulse operations manager 356 from which of the modification settings circuits $504_k$ to retrieve values to be sent to pulser $302_l$ as f_dmod$_l$. The pulser $302_l$ may determine dmod_slct$_l$ based on the particular quantum element $122_k$ and/or signal path $315_k$ from which the pulse to be processed arrived. The determination of from which quantum element and/or signal path a particular pulser $302_l$ is to process an inbound pulse at a particular time may be predetermined in the quantum algorithm description or may be determined based on calculations performed by the pulser $302_l$ and/or others of the pulsers $302_0$-$302_{L-1}$ during runtime. The control circuitry 502 may then use this information to configure the routing block 506 such that the correct modification settings are routed to the correct one of the pulsers $302_0$-$302_{L-1}$. For example, when pulse generation circuit $302_l$ needs to demodulate a pulse signal AI$_l$ from quantum element $122_k$, it will send a dmod_sclt$_l$ signal instructing the pulse operation manager 356 to rout the element SF$_{k00}$=cos($\omega_k$*time_stamp+$\phi_k$) from modification settings circuit $504_k$ to pulser $302_l$ (as f_dmod$_l$).

In the example implementation shown, the digital signals $C_0$-$C_{K-1}$ provide information about signal-path-specific modification settings to be used for each of the signal paths $313_0$-$313_{K-1}$. For example, each signal $C_k$ may comprise a matrix to be multiplied by a matrix representation of a raw outbound pulse CP$'_l$ such that the resulting output outbound pulse is pre-compensated for errors (e.g., resulting from imperfections in mixers, amplifiers, wiring, etc.) introduced as the outbound pulse propagates along signal path $313_k$. The result of the pre-compensation is that output outbound pulse CP$_l$ will have the proper characteristics upon arriving at the quantum processor 218. The signals $C_0$-$C_{K-1}$ may, for example, be calculated by the quantum controller 210 itself, by the programming subsystem 202, and/or by external calibration equipment and provided via I/O manager 368. The calculation of signals may be done as part of a calibration routine which may be performed before a quantum algorithm and/or may be determined/adapted in real-time as part of a quantum algorithm (e.g., to compensate for temperature changes during the quantum algorithm).

Figure 6A:
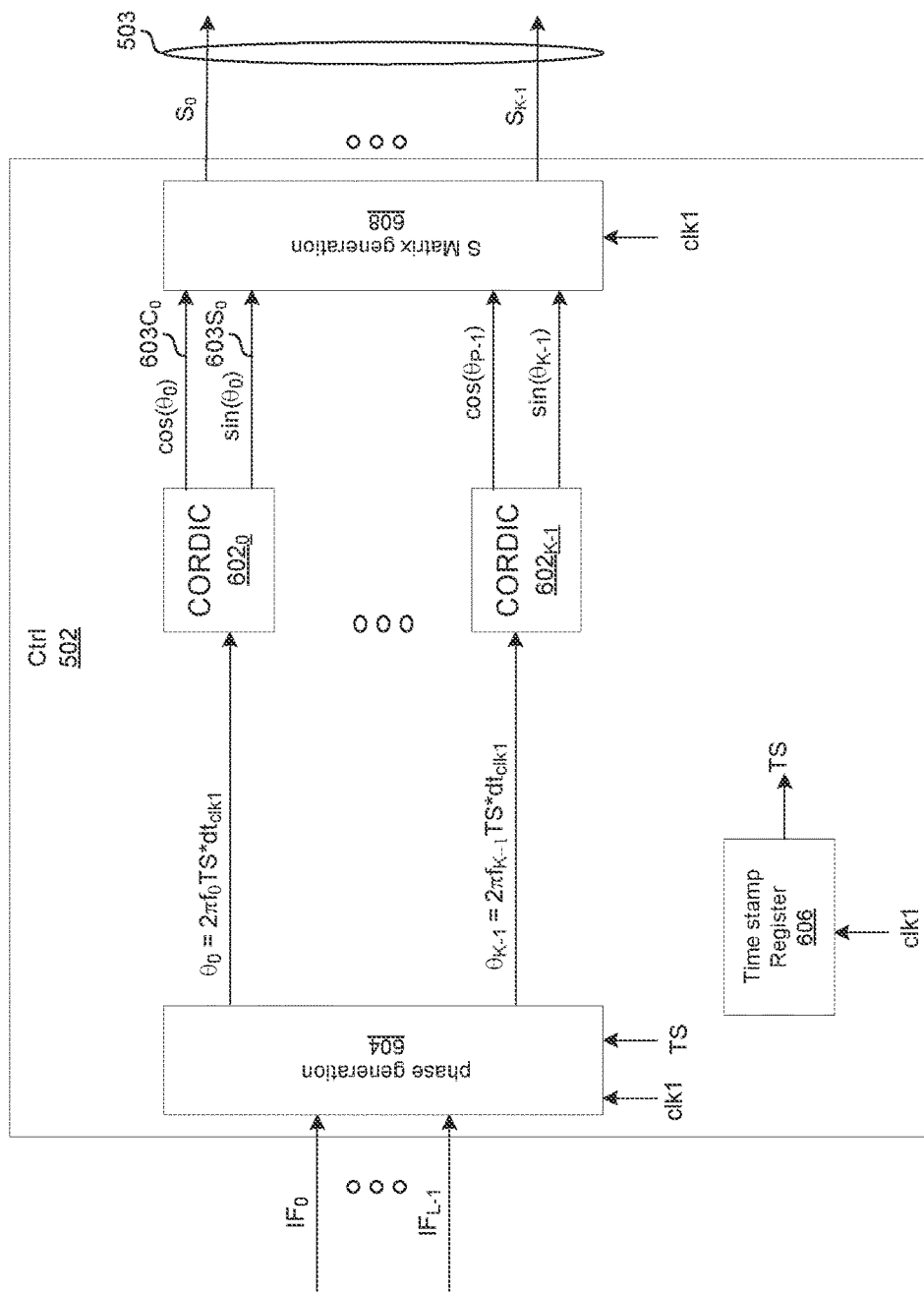
FIG. 6A shows frequency generation circuitry of the quantum controller of FIG. 3B.

FIG. 6A shows frequency generation circuitry of the quantum controller of FIG. 3B. In the example implementation shown, the frequency generation circuitry is part of control circuitry 502 of pulse operations manager circuitry 356. The frequency generation circuitry comprises K coordinate rotation digital computer (CORDIC) circuits $602_0$-$602_{K-1}$, phase generation circuitry 604, timestamp register 606, and S-Matrix generation circuitry 608.

Each CORDIC circuit $602_k$ is operable to compute cosine and sine of its input, $\theta_k$, thus generating two signals $\cos(\theta_k)$ and $\sin(\theta_k)$.

The phase generation circuitry 604 is operable to generate the CORDIC input parameters $\theta_0$-$\theta_{K-1}$ based on: (1) the frequency setting signals IF$_0$-IF$_{L-1}$ from the pulsers $302_0$-$302_{L-1}$; and (2) the contents, TS, of the timestamp register 606.

The timestamp register 606 comprises circuitry (e.g., a counter incremented on each cycle of the clock signal clk1) operable to track the number of cycles of clk1 since a reference point in time (e.g., power up of the quantum controller 210, start of execution of set of instructions of a quantum algorithm by the quantum controller 210, etc.).

In the example shown, the phase generation circuitry 604 sets $\theta_0 = 2\pi f_0(TS)(dt_{clk1})$, where $f_0$ is a frequency determined from the signal IF$_0$, TS is the number of clock cycles counted from the reference point and $dt_{clk1}$ is the duration of a single clock cycle of clk1. This leads to the CORDIC outputs being a pair of phase-quadrature reference signals, $\cos(2\pi f_0(TS)(dt_{clk1}))$ and $\sin(2\pi f_0(TS)(dt_{clk1}))$, as in the example shown, which are used to generate the $S_0$ rotation matrix that rotates at a frequency $f_0$.

Figure 6B:
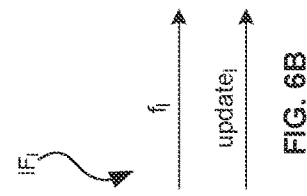
FIG. 6B shows example components of the control signal $IF_l$ of FIG. 6A.

As shown in FIG. 6B, the signal IF$_l$ may comprise an update component and an $f_l$ component. In an example implementation, when update$_l$ is asserted then the phase generation circuitry updates one of more of $f_0$-$f_{K-1}$ to be the value of $f_l$.

In another example implementation the phase generation circuitry 604 can also generate CORDIC input parameters $\theta_0$-$\theta_{K-1}$ that depend on time in a non-linear manner in order, for example, to generate an S-matrix that rotates at a frequency that increases or decreases in time (chirp). A chirp is a signal of the form $s(t)=\cos(\omega(t)t)$, meaning that the frequency changes with time. A linear chirp can be written as $\omega(t)=\omega_0+\alpha t$ for some constant $\alpha$, so that $s(t)=\cos(\omega t+\alpha t^2)$.

Note that here this expression assumes starting the chirp at t=0. If a constant frequency is first generated from t=0 to t=$t_0$ and then the chirp starts, that can be expressed as s(t)=cos (ωt+α(t−$t_0$)t). The phase of such a signal can be written as $\theta_k=2\pi f_k(TS)(dt_{clk1})+2\pi(\delta f_k)(TS-TS^C)TS*dt_{clk1}$, where $\delta f_k$ is the change in frequency per clock cycle of clk1 for the chirp, and $TS^C$ is the timestamp at which the chirp is to start (and $TS^C$=TS for timestamps before the chirp starts). An example implementation for a system that generates linear chirps is shown in FIG. 12. Systems in accordance with this disclosure can generate a signal having such a phase without having to do the whole multiplication every time. Instead such systems can increment the phase every cycle. For examples, as described above, in the case of a signal with a fixed frequency (not a chirp), the phase is incremented by $\theta_{inc}=2\pi f_k(dt_{clk1})$ every clock cycle. Similarly, in the case of a linear chirp, the phase is incremented by $\theta_{inc}=2\pi f_k(dt_{clk1})+2\pi(\delta f_k)(TS-TS^C)$ every cycle and therefore the phase increment, $\theta_{inc}$, itself can be calculated not by multiplication, but by incrementing it by $d\phi_{inc}=2\pi(\delta f_k)$ every clock cycle. In one implementation the phase calculation can be done by the phase generation circuitry 604 as indicated by the pulser via the signal $IF_l$ (indicating for example whether a chirp should be performed and with what frequency increments). In another implementation the frequency can be provided by the pulser itself via the $IF_l$ signal along the chirp. In FIG. 6A, for example, $S_0$ could be chirped by pulser $302_0$ changing the frequency $f_0$ on each clock cycle so that $f=f_0+(\delta f_0)(TS-TS^C)$. One advantage of this approach is that, because $f_0$ is calculated by the pulser $302_0$ and pulser $302_0$ comprises circuitry for performing complex calculations, then complicated chirps such as nonlinear chirps (chirps with different rates of frequency change), can be achieved.

The S-matrix generation circuitry 608 is operable to build the matrices $S_0$-$S_{K-1}$ from the outputs of the CORDIC circuits $602_0$-$602_{K-1}$. In an example implementation, the S-matrix generation circuit 606 is operable to synchronize changes to the S matrices such that any matrix update occurs on a desired cycle of clock clk1 (which may be determined by the control information $IF_0$-$IF_{L-1}$).

With K CORDIC circuits $602_k$, the frequency generation circuitry is operable to concurrently generate K S-matrices. In instances that more than K frequencies are needed over the course of a set of instructions, the phase generation circuit 604 is operable to change the input parameter $\theta_k$ of one or more of the CORDIC circuits $602_0$-$602_{K-1}$ to stop generating one frequency and start generating the K+1$^{th}$ frequency. In some instances, it may be necessary for the new frequency to start at a phase θ that would have been the phase if the new frequency was being generated from the initial reference time (e.g., because the new frequency would be used to address a quantum element that has a resonance at the new frequency and that was coherent since the reference point). In some other instances, it might be necessary to start the new frequency from the phase that the old frequency ended in. The phase generation circuit 604 and timestamp register 606 enable both of these possibilities, as further described below with reference to FIGS. 7A and 7B.

Figure 7A:
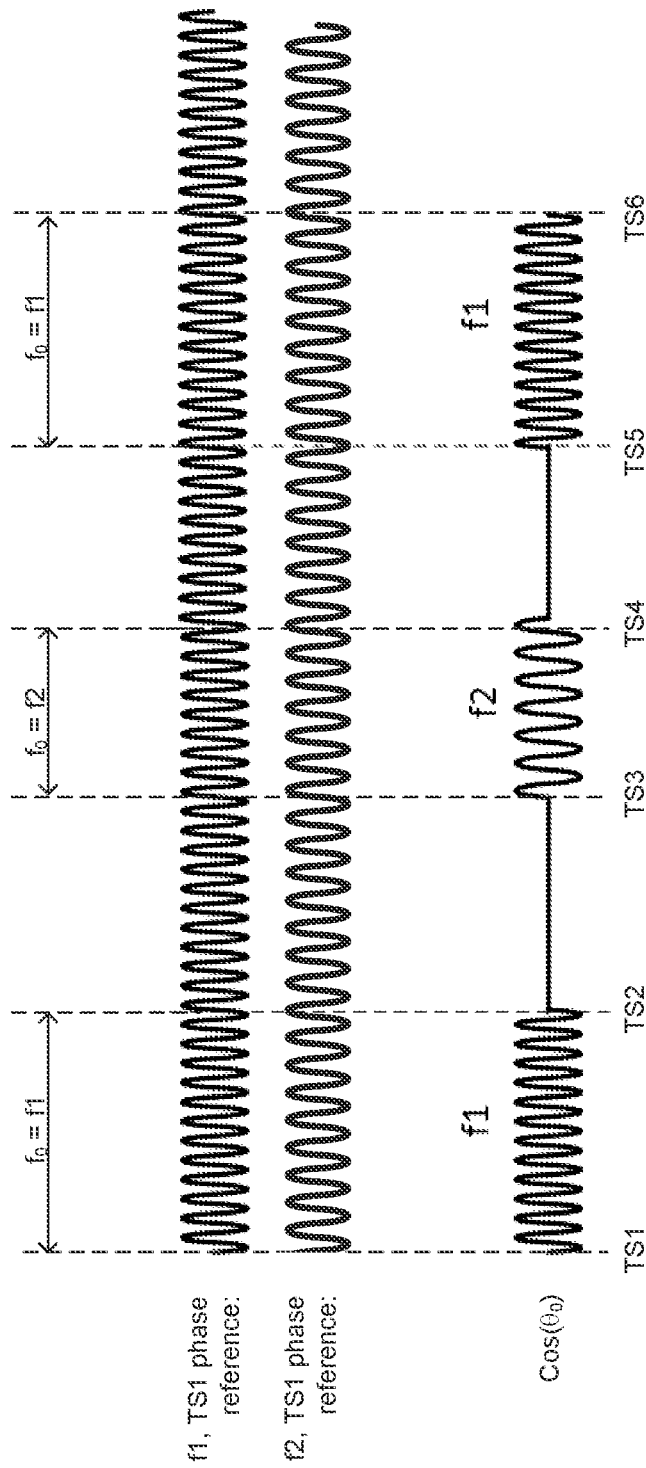
FIGS. 7A and 7B illustrate phase continuity across frequency hops in the frequency generation circuitry of FIGS. 6A and 6B.
Figure 7B:
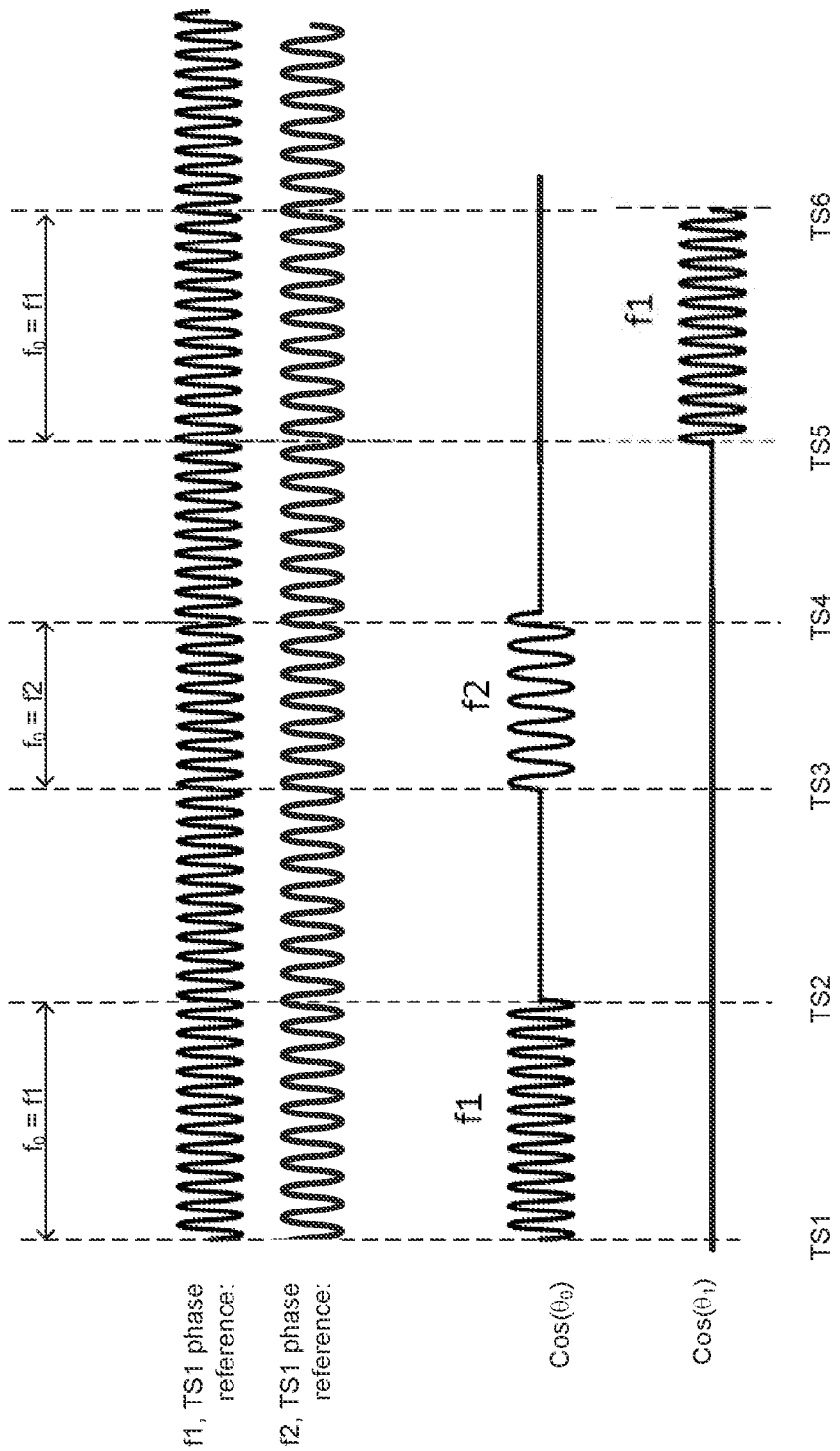

FIGS. 7A and 7B illustrate phase continuity across frequency hops in the frequency generation circuitry of FIGS. 6A and 6B. In FIG. 7, CORDIC $602_0$ was arbitrarily selected for illustrating phase continuity, but any of the CORDICs $602_0$-$602_{N-1}$ could be used. Similarly, as shown in FIG. 7B, a first one of the CORDICs could have been chosen to generate f1 during the first time interval and a second of the CORDICs could generate f1 during the third time interval, while still providing phase continuity.

From TS=TS1 to TS=TS2, phase generation circuitry 604 generates (based on control signal $IF_0$) a value of $\theta_0$ such that CORDIC $602_0$ generates a pair of phase-quadrature signals at frequency f1 (i.e., $\theta_0=2\pi(TS)(dt_{clk1})$, where $dt_{clk1}$ is the period of clk1). The two signals can be represented as cos($\theta_0$) and sin($\theta_0$). For simplicity of illustration, only the cosine signal is shown in FIGS. 7A and 7B.

From TS=TS3 to TS=TS4, phase generation circuitry 604 generates (based on control signal $IF_0$) a value of $\theta_0$ such that CORDIC $602_0$ generates a pair of phase-quadrature signals at frequency f2. As shown, the phase of cos($\theta_0$) when it changes frequency to f2 at TS3 is the phase that the signal would have been at if the signal would have been at frequency f2 from the beginning (i.e. from the reference point).

From TS=TS5 to TS=TS6 phase generation circuitry 604 generates (based on control signal $IF_0$) a value of $\theta_0$ such that CORDIC $602_0$ returns to generating a pair of phase-quadrature signals at frequency f1. As shown, the phase of signal 702 when it returns to f1 at TS5 is the phase that the signal would have been at if the frequency never changed and CORDIC $602_0$ had been continuously generating f1 since TS1.

Figure 8A:
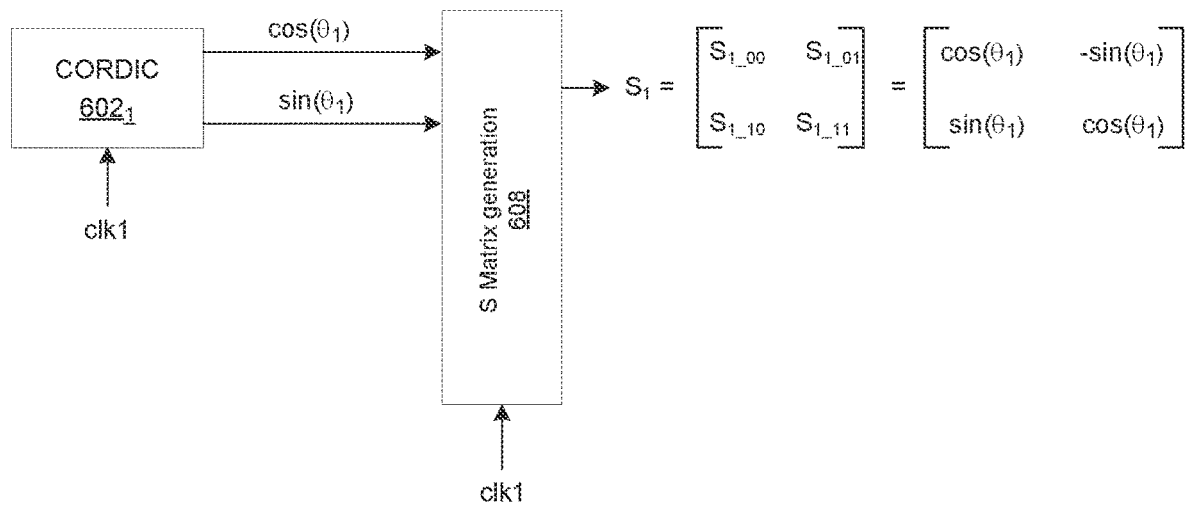
FIGS. 8A and 8B illustrate upconversion of a quantum control pulse in an example implementation of this disclosure.

FIG. 8A illustrates an example scenario in which a pulse $CP'_l$ from pulser $302_1$ is to be upconverted to f1. Accordingly, in FIG. 8A, based on control signal(s) $IF_1$ from pulser $302_1$, phase generation circuitry 604 has generated a value of 01 that changes every clock cycle according to f1, and S-Matrix generation circuit 608 uses the outputs of CORDIC $602_1$ to generate $S_1$ (which routing circuit 506 of FIG. 5 may then route to pulse modification circuit $508_1$). In an example implementation, pulse modification setting $504_1$ (which includes matrix $S_1$, which rotates with frequency f1) is selected from among the pulse modification settings $504_0$-$504_{K-1}$ to be used in the pulse modification for this particular pulse. This choice may be based on a pulse modification scheduling algorithm that, for example, seeks to minimize the number of frequency hops that the frequency generation circuitry of 502 has to perform during execution of a set of instructions.

Figure 8B:
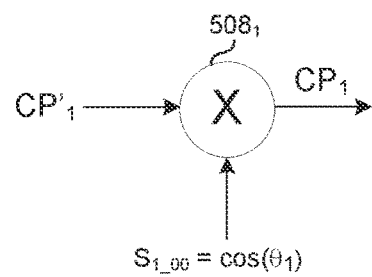

In FIGS. 8B, for clarity of illustration, it is assumed the pulse $CP'_1$ is an independent pulse (as opposed to a two-pulse pair, as discussed in U.S. patent application Ser. No. 16/247,115, which is hereby incorporated herein by reference in its entirety). Thus, as shown, pulse modification circuit 5083 upconverts the pulse $CP'_1$ using the first element of the $S_1$ matrix, $S_{1\_00}$, to generate $CP_1$. For clarity of illustration the other modifications which may be performed in pulse modification circuitry $508_1$ (e.g., multiplication by the F and C matrices described above) are not shown in FIG. 8B.

Figure 9:
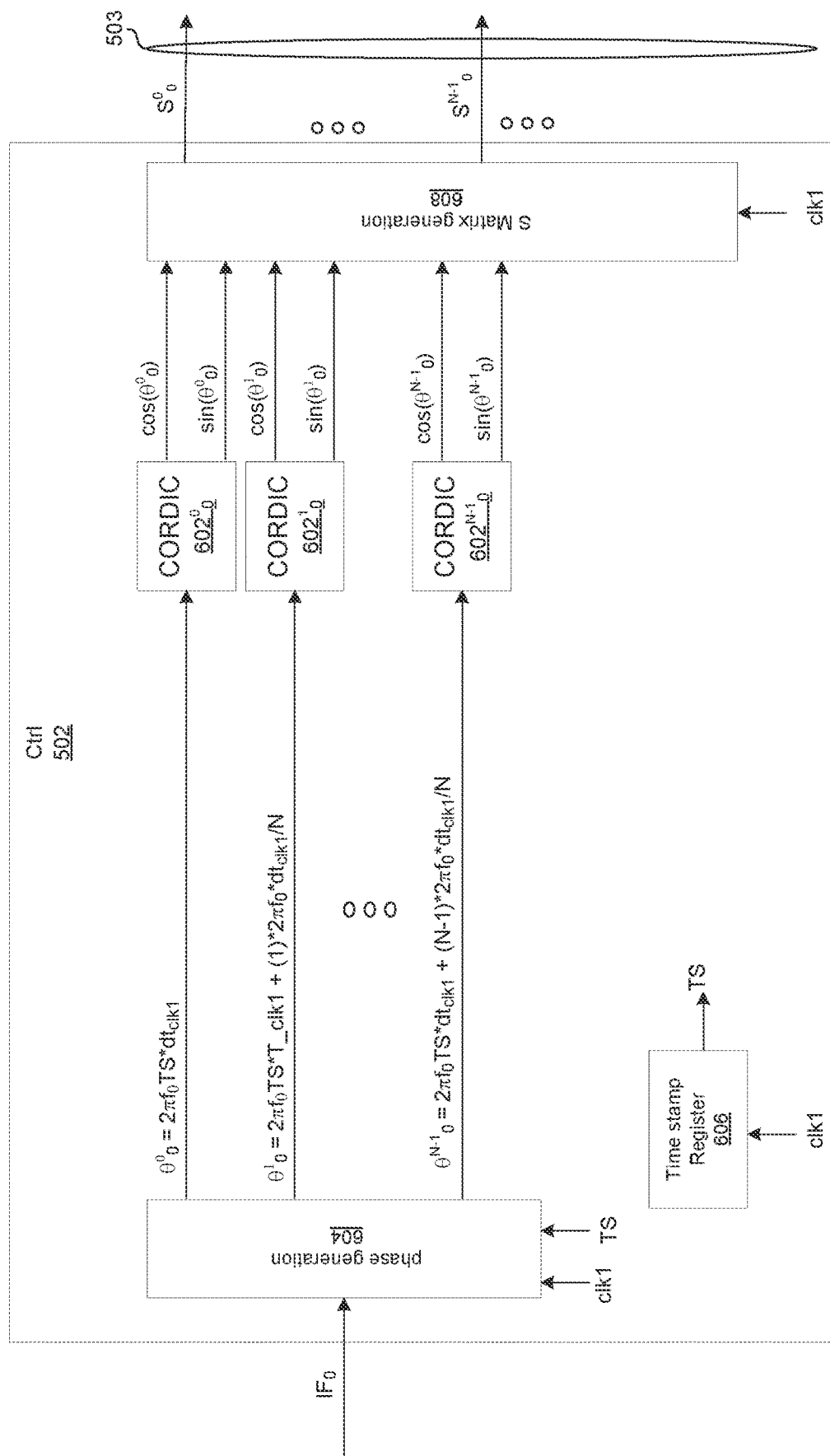
FIG. 9 shows an example configuration of the frequency generation circuitry of FIGS. 6A and 6B to support higher output sample rates.

FIG. 9 shows configuration of the frequency generation circuitry of FIGS. 6A and 6B to support sample rates higher than the frequency of the clock, clk1, that clocks the frequency generation circuitry of 502. In FIG. 9, each CORDIC $602_k$ (k an integer between 0 and K−1) of FIG. 6A is replaced by N CORDICs $602_k^0$-$602_k^{N-1}$ (only $602_0^0$-$602_0^{N-1}$ are shown for simplicity of illustration), and each S matrix $S_k$, is replaced by N S matrices $S_k^0$-$S_k^{N-1}$.

For the CORDICS $602_k^0$-$602_k^{N-1}$, the phase generation circuitry generates N phase parameter values, where each is given by $\theta_k^n=2\pi f_k(TS)(dt_{clk1})+(n/N)2\pi f_k(dt_{clk1})$, and $f_k$ is the frequency instructed by $IF_k$, TS is the value of the timestamp register 606, $dt_{clk1}$ is the period of clk1, N is an integer upsampling factor, and n is an integer from 0 to N−1. Thus, the CORDICs $602_0^0$-$602_0^{N-1}$ generate N pairs of signals with each pair having a phase offset of $(n/N)2\pi f_0(dt_{clk1})$ relative to the previous pair. The S matrix generation circuitry 608 then generates N S matrices from the N signal pairs.

Figure 10A:
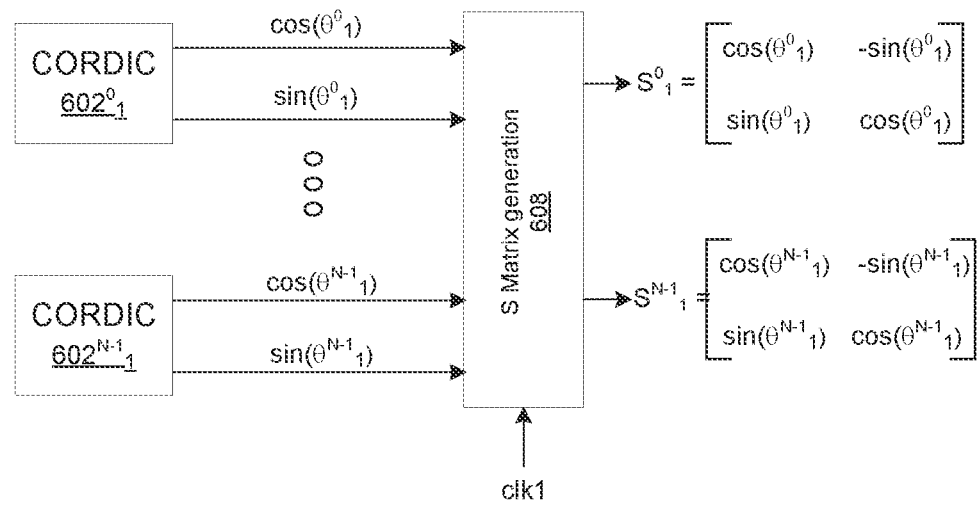
FIGS. 10A and 10B illustrate upconversion of a quantum control pulse in an example implementation of this disclosure.
Figure 10B:
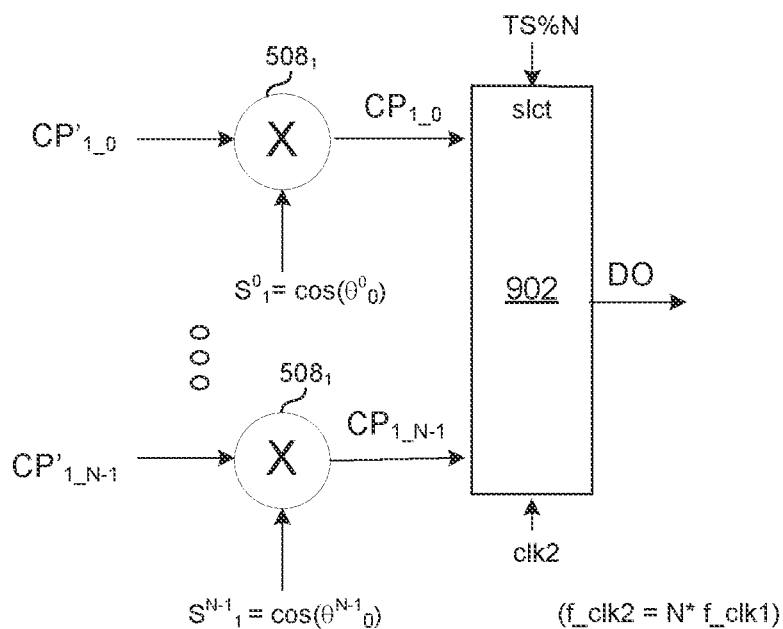

FIGS. 10A and 10B illustrate upconversion of a quantum control pulse in an example implementation of this disclosure. The scenario illustrated in FIGS. 10A and 10B is the same as in FIGS. 8A and 8B, except that $CP_1$ is required to be at a sample rate that is N times higher than the frequency of clk1. To generate a signal at a sample rate f_clk2=N (f_clk1), N CORDICS are configured to generate N S-matrices $S_1^0$-$S_1^{N-1}$ all of which are changing with frequency f1, but each with a different phase offset and the offset of CORDIC $602_1^n$ is given by $(n/N)2\pi f_0(dt_{clk1})$).

As shown in FIG. 10B, the matrices $S_1^0$-$S_1^{N-1}$ are routed to pulse modification circuit $508_1$, where each of N samples of $CP'_1$ ($CP'_{1\_0}$-$CP'_{1\_N-1}$) is upconverted using a respective one of the S matrices $S_1^0$-$S_1^{N-1}$ to generate the signals $CP_{1\_0}$-$CP_{1\_N-1}$. Then interface circuit 902 which is a part of output manager 360 and is clocked at f_clk2, cyclically selects samples of $903^0$-$903^{N-1}$ to be output as $DO_1$ (e.g., may select $CP_{1\_n-1}$ when TS % N=n) on each cycle of clk2.

Figure 11:
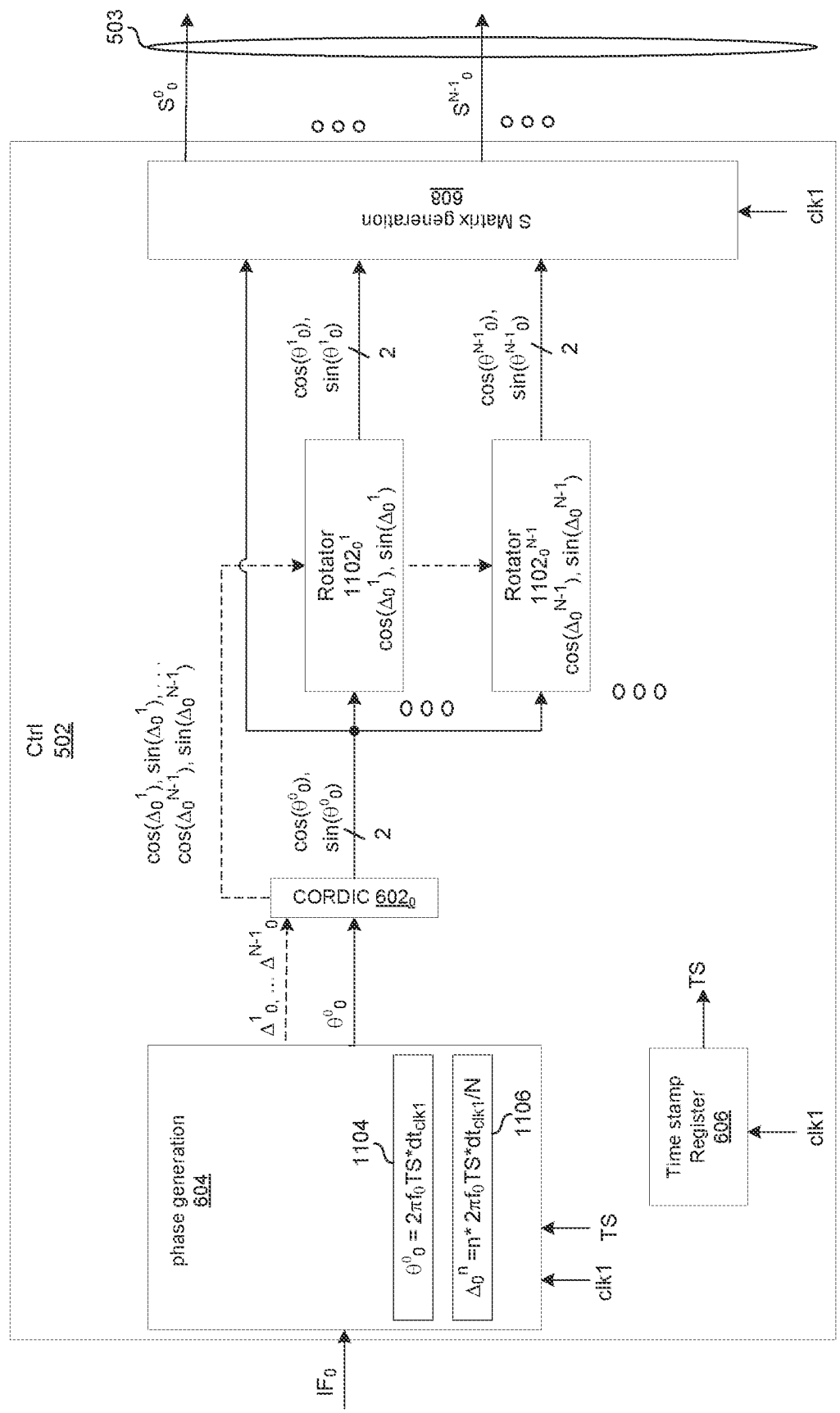
FIG. 11 shows another example configuration of the frequency generation circuitry of FIGS. 6A and 6B to support higher output sample rates.

FIG. 11 shows another example configuration of the frequency generation circuitry of FIGS. 6A and 6B to support higher output sample rates. The example implementation in FIG. 11 uses a single CORDIC circuit 602 as compared to N CORDIC circuits in the example implementation of FIG. 9.

In FIG. 11, the phase generation circuitry 604 is operable to generate, for each set of n CORDICs $602_k^0$-$602_k^{N-1}$ (k an integer from 0 to K), phase parameter $\theta_k^0$ (e.g., stored in a register 1104) and phase increment parameters $\Delta_k^1$-$\Delta_k^{N-1}$ (e.g., stored in a register 1106), where $\Delta_k^n=(n/N)2\pi f_0(dt_{clk1})$. For simplicity of illustration only k=0 is shown in FIG. 11.

In operation, a change of the S matrices begins with the phase generation circuitry 604 sequentially outputting each of $\Delta_k^1$-$\Delta_k^{N-1}$ to the CORDIC $602_k$ to generate rotation parameters $\cos(\Delta_k^1)$, $\sin(\Delta_k^1)$, ... $\cos(\Delta_k^{N-1})$, $\sin(\Delta_k^{N-1})$, which are then input, respectively to phase rotator circuits $1102_k^0$-$1102_k^{N-1}$ (e.g., written to registers of the phase rotator circuits $1102_k^0$-$1102_k^{N-1}$.

Once, the rotation parameters have been generated, the phase generation circuit $604_k$ begins outputting $\theta_k^0=2\pi f_0 (TS)dt_{clk1}$ to CORDIC $602_k$, to generate $\cos(\theta_k^0)$ and $\sin(\theta_k^0)$ which are then output to the S-matrix generation circuit 608 and to each of the phase rotation circuits $1102_k^1$-$1102_k^{N-1}$. Each phase rotation circuit $1102_0^n$ then performs a multiplication of the matrix $$\begin{pmatrix} \cos(\Delta_k^n) & -\sin(\Delta_k^n) \\ \sin(\Delta_k^n) & \cos(\Delta_k^n) \end{pmatrix}$$

by the vector $$\begin{pmatrix} \cos(\theta_k^0) \\ \sin(\theta_k^0) \end{pmatrix}$$

to generate $\cos(\theta_k^n)$ and $\sin(\theta_k^n)$, where $\theta_k^n=\theta_k^0+\Delta_k^n$.

FIG. 12 shows an example frequency generation circuitry operable to generate chirps. In an example implementation, FIG. 12, the signal $IF_l$ comprises two additional signals beyond those shown in FIG. 6B: (1) $chirp_l$, which indicates when a chirp is to start (e.g., is high during a chirp and low otherwise); and (2) $\delta f_l$ which indicates the rate of frequency change for the chirp (a positive value of $\delta f_k$ resulting in an upchirp and a negative value of $\delta f_k$ resulting in a down chirp). The phase generation circuitry 604 then generates $\theta_k=2\pi f_k(dt_{clk1})+2\pi(\delta f_k)(TS-TS_k^C)(TS)dt_{clk1}$, where $TS_k^C$ is the clock cycle at which the chirp starts. When a chirp is not in progress (e.g., indicated by $chirp_k$ being low) then the second term in $\theta_k$ is 0, resulting in a constant frequency signal. In an example implementation, $\delta f_k$ may be fixed for each chirp. In another example implementation, the phase generation circuitry 604 may reach $\delta f_k$ on each clock cycle for which chirp is high and thus the pulser that is generating $\delta f_k$ can manipulate $\delta f_k$ to achieve non-linear chirps.

In accordance with an example implementation of this disclosure, a quantum controller (e.g., 210) comprising quantum control pulse generation circuitry (e.g., Pulsers $302_0$-$302_{L-1}$), signal generation circuitry (e.g., $602_0$-$602_{K-1}$), and phase parameter generation circuitry (e.g., 604). The quantum control pulse generation circuitry is operable to generate a sequence of two quantum control pulses (e.g., $CP_{0,T1}$, $CP_{0,T2}$). The phase parameter generation circuitry is operable to determine, based on an output of the time-tracking circuitry, a first value of a phase parameter (e.g., $2\pi f_k TS1*dt_{clk1}$) to be used for generation of an oscillating signal (e.g., $S_{L\_00}$ of FIG. 8B). The signal generation circuitry is operable to, at a first time (e.g., TS1 of FIG. 7A), begin generation of the oscillating signal for modulation of a first of the two quantum control pulses; at a second time (e.g., TS2 of FIG. 7A) after the first time, cease generation of the oscillating signal; and at a third time (e.g., TS5 of FIG. 7A) after the second time, resume generation of the oscillating signal for modulation of the second quantum control pulse, wherein the phase of the oscillating signal is determined by the value of the phase parameter such that the phase of the oscillating signal is as it would have been if the oscillating signal had been generated continuously since the reference time. The output of the time-tracking circuitry (e.g., 606) may correspond to an amount of time lapsed between since a reference time. The time-tracking circuitry may comprise a register (e.g., 606) operable to store a value and increment the value on each cycle of a clock that also clocks the signal generation circuitry (e.g., clk1). The signal generation circuitry may comprises a plurality of signal generation units (e.g., $602_0$-$602_{K-1}$) in parallel. From the first time to the second time, the oscillating signal may be generated by a first of the signal generation units (e.g., $602_0$), and from the third time to a fourth time, the oscillating signal is generated by the first of the signal generation units. Alternatively, From the first time to the second time, the oscillating signal may be generated by a first of the signal generation units (e.g., $602_0$), and from the third time to a fourth time, the oscillating signal is generated by a second of the signal generation units (e.g., $602_1$). The phase parameter generation circuitry may be operable to generate N−1 phase offset values (e.g., $(n/N)2\pi f_k T\_clk1$, for n from 0 to N−1) to be used for generation of the oscillating signal from the first time to the second time, where N is an integer greater than 1. The signal generation circuitry may comprise N signal generation units (e.g., $602_0^0$-$602_0^{N-1}$). From the first time to the second time, each of N-1 of the signal generation units may generate cosine and sine values based on the first value of the phase parameter and a respective one of the N−1 phase offset values. Each of the N signal generation units may be a CORDIC circuit. The N signal generation units may comprise N−1 phase rotator circuits (e.g., $1102_0^1$-$1102_0^{N-1}$) and only one CORDIC circuit (e.g., $602_0$). The quantum controller may comprise matrix generation circuitry (e.g., 608) operable to generate a matrix from the output of the signal generation circuitry. The phase parameter generation circuitry may be operable to determine an amount by which to increase or decrease the phase parameter based on a value (e.g. value of $f_i$) received from the quantum control pulse generation circuitry. The quantum control pulse generation circuitry may be operable to calculate the value during runtime based on a feedback signal (e.g., $AI_i$) from a quantum system (e.g., 218). The phase parameter generation circuitry may be operable to generate the value of the phase parameter based on a control signal (e.g., $IF_i$) from the quantum control pulse generation circuitry. The control signal may indicate a frequency at which the oscillating signal should be generated (e.g. as a value of component $f_i$).

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical implementation may comprise one or more application specific integrated circuit (ASIC), one or more field programmable gate array (FPGA), and/or one or more processor (e.g., x86, x64, ARM, PIC, and/or any other suitable processor architecture) and associated supporting circuitry (e.g., storage, DRAM, FLASH, bus interface circuits, etc.). Each discrete ASIC, FPGA, Processor, or other circuit may be referred to as "chip," and multiple such circuits may be referred to as a "chipset." Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to perform processes as described in this disclosure. Another implementation may comprise a non-transitory machine-readable (e.g., computer readable) medium (e.g., FLASH drive, optical disk, magnetic storage disk, or the like) having stored thereon one or more lines of code that, when executed by a machine, cause the machine to be configured (e.g., to load software and/or firmware into its circuits) to operate as a system described in this disclosure. As used herein, the term "based on" means "based at least in part on." For example, "x based on y" means that "x" is based at least in part on "y" (and may also be based on z, for example).

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A system comprising:
   signal generation circuitry operable to generate an oscillating signal, wherein
   the signal generation circuitry comprises time-tracking circuitry and phase generation circuitry, wherein:
   the phase generation circuitry is operable to maintain phase continuity during a frequency change, and
   a phase of the oscillating signal is determined according to time elapsed since a reference time, as determined by the time-tracking circuitry.

2. The system of claim 1, wherein the signal generation circuitry comprises a register operable to store a time-tracking value, and wherein the time-tracking circuitry is operable to increment the time-tracking value on each cycle of a clock.

3. The system of claim 1, wherein the signal generation circuitry comprises a hardware gate array.

4. The system of claim 1, wherein the signal generation circuitry comprises a coordinate rotation circuit.

5. The system of claim 1, wherein the signal generation circuitry is operable to alter a plurality of phase parameters over time to during the frequency change.

6. The system of claim 1, wherein a plurality of phase parameters is generated according to a frequency offset signal.

7. The system of claim 6, wherein the signal generation circuitry is operable to adjust the frequency offset signal according to a feedback signal.

8. The system of claim 1, wherein the signal generation circuitry is operable to generate the desired frequency.

9. The system of claim 8, wherein the signal generation circuitry is operable to alter the desired frequency according to a feedback signal.

10. The system of claim 1, wherein each of a plurality of phase parameters has a phase offset relative to others of the phase parameters.

11. A system comprising:
    a function generator circuit operable to generate, via phase generation circuitry, a plurality of phase parameters according to time elapsed, as determined by time-tracking circuitry, since a reference time, wherein the plurality of phase parameters maintain phase continuity across changes in a desired frequency.

12. The system of claim 11, wherein the function generator circuit comprises a register operable to store a time-tracking value, and wherein the time-tracking circuitry is operable to increment the time-tracking value on each cycle of a clock.

13. The system of claim 11, wherein the function generator circuit is operable to generate an oscillating signal according to the plurality of phase parameters.

14. The system of claim 11, wherein the function generator circuit comprises a coordinate rotation circuit.

15. The system of claim 11, wherein the function generator circuit is operable to alter a phase parameter, of the plurality of phase parameters, over time during changes in a desired frequency.

16. The system of claim 11, wherein the plurality of phase parameters is generated according to a frequency offset signal.

17. The system of claim 16, wherein the function generator circuit is operable to adjust the frequency offset signal according to a feedback signal.

18. The system of claim 11, wherein the function generator circuit is operable to generate the desired frequency.

19. The system of claim 18, wherein the function generator circuit is operable to alter the desired frequency according to a feedback signal.

20. The system of claim 11, wherein the function generator circuit is operable to change the desired frequency from a first value to a second value and then back to the first value.

* * * * *